United States Patent
Scanlan et al.

(10) Patent No.: US 9,754,835 B2
(45) Date of Patent: Sep. 5, 2017

(54) SEMICONDUCTOR DEVICE AND METHOD COMPRISING REDISTRIBUTION LAYERS

(71) Applicant: DECA Technologies Inc., Tempe, AZ (US)

(72) Inventors: Christopher M. Scanlan, Chandler, AZ (US); Craig Bishop, Tempe, AZ (US)

(73) Assignee: DECA Technologies Inc., Tempe, AZ (US)

( * ) Notice: Subject to any disclaimer, the term of this patent is extended or adjusted under 35 U.S.C. 154(b) by 0 days.

(21) Appl. No.: 15/292,082

(22) Filed: Oct. 12, 2016

(65) Prior Publication Data

US 2017/0033009 A1    Feb. 2, 2017

Related U.S. Application Data

(60) Continuation-in-part of application No. 14/930,514, filed on Nov. 2, 2015, now Pat. No. 9,576,919, which
(Continued)

(51) Int. Cl.
*H01L 21/50*    (2006.01)
*H01L 21/78*    (2006.01)
(Continued)

(52) U.S. Cl.
CPC ............ *H01L 21/78* (2013.01); *H01L 21/561* (2013.01); *H01L 21/568* (2013.01); *H01L 21/76877* (2013.01); *H01L 23/3128* (2013.01); *H01L 23/48* (2013.01); *H01L 23/49827* (2013.01); *H01L 24/02* (2013.01); *H01L 24/05* (2013.01); *H01L 24/13* (2013.01); *H01L 24/19* (2013.01); *H01L 24/20* (2013.01); *H01L 24/92* (2013.01); *H01L 24/96* (2013.01); *H01L 23/295* (2013.01); *H01L 23/3114* (2013.01); *H01L 23/562* (2013.01); *H01L 24/03* (2013.01);
(Continued)

(58) Field of Classification Search
CPC ....... H01L 21/568; H01L 21/78; H01L 24/19; H01L 23/3128; H01L 24/03; H01L 21/76877; H01L 24/92
USPC .......................................... 438/113
See application file for complete search history.

(56) References Cited

U.S. PATENT DOCUMENTS

| | | |
|---|---|---|
| 4,687,693 A | 8/1987 | Sheyon et al. |
| 4,894,115 A | 1/1990 | Eichelberger et al. |

(Continued)

*Primary Examiner* — Luan C Thai
(74) *Attorney, Agent, or Firm* — Booth Udall Fuller, PLC

(57) ABSTRACT

A method of making a semiconductor package can include placing a single layer dielectric film on a temporary carrier substrate. A plurality of semiconductor die can be placed directly on the first surface of the single layer dielectric film. The single layer dielectric film can be cured to lock the plurality of semiconductor die in place on the single layer dielectric film. The plurality of semiconductor die can be encapsulated while directly on the single layer dielectric film with an encapsulant. The single layer dielectric film can be patterned utilizing a mask-less patterning technique to form a via hole after removing the temporary carrier substrate. A conductive layer can be formed directly on, substantially parallel to, and extending across, the second surface of the patterned single layer dielectric film, within the vial hole, and over the plurality of semiconductor die.

19 Claims, 11 Drawing Sheets

Related U.S. Application Data is a continuation-in-part of application No. 14/642,531, filed on Mar. 9, 2015, now Pat. No. 9,177,926, and a continuation-in-part of application No. 14/584,978, filed on Dec. 29, 2014, now Pat. No. 9,337,086, which is a continuation of application No. 14/024,928, filed on Sep. 12, 2013, now Pat. No. 8,922,021, which is a continuation of application No. 13/632,062, filed on Sep. 30, 2012, now Pat. No. 8,535,978, which is a continuation-in-part of application No. 13/341,654, filed on Dec. 30, 2011, now Pat. No. 8,604,600, application No. 15/292,082, which is a continuation-in-part of application No. 14/261,265, filed on Apr. 24, 2014, now abandoned, which is a division of application No. 12/985,212, filed on Jan. 5, 2011, now abandoned.

(60) Provisional application No. 61/950,743, filed on Mar. 10, 2014, provisional application No. 61/672,860, filed on Jul. 18, 2012, provisional application No. 61/305,122, filed on Feb. 16, 2010.

(51) Int. Cl.
*H01L 21/56* (2006.01)
*H01L 23/498* (2006.01)
*H01L 21/768* (2006.01)
*H01L 23/31* (2006.01)
*H01L 23/48* (2006.01)
*H01L 23/00* (2006.01)
*H01L 23/29* (2006.01)

(52) U.S. Cl.
CPC ............ *H01L 24/11* (2013.01); *H01L 24/94* (2013.01); *H01L 2224/0239* (2013.01); *H01L 2224/02311* (2013.01); *H01L 2224/02313* (2013.01); *H01L 2224/02331* (2013.01); *H01L 2224/02377* (2013.01); *H01L 2224/0345* (2013.01); *H01L 2224/03452* (2013.01); *H01L 2224/03462* (2013.01); *H01L 2224/03464* (2013.01); *H01L 2224/0401* (2013.01); *H01L 2224/04105* (2013.01); *H01L 2224/05008* (2013.01); *H01L 2224/05024* (2013.01); *H01L 2224/0558* (2013.01); *H01L 2224/05147* (2013.01); *H01L 2224/05166* (2013.01); *H01L 2224/05548* (2013.01); *H01L 2224/05568* (2013.01); *H01L 2224/05569* (2013.01); *H01L 2224/05572* (2013.01); *H01L 2224/05573* (2013.01); *H01L 2224/05611* (2013.01); *H01L 2224/05624* (2013.01); *H01L 2224/05639* (2013.01); *H01L 2224/05644* (2013.01); *H01L 2224/05647* (2013.01); *H01L 2224/05655* (2013.01); *H01L 2224/05664* (2013.01); *H01L 2224/05666* (2013.01); *H01L 2224/05669* (2013.01); *H01L 2224/05671* (2013.01); *H01L 2224/05687* (2013.01); *H01L 2224/1132* (2013.01); *H01L 2224/1145* (2013.01); *H01L 2224/11334* (2013.01); *H01L 2224/11452* (2013.01); *H01L 2224/11462* (2013.01); *H01L 2224/11464* (2013.01); *H01L 2224/11849* (2013.01); *H01L 2224/11901* (2013.01); *H01L 2224/12105* (2013.01); *H01L 2224/131* (2013.01); *H01L 2224/13024* (2013.01); *H01L 2224/13111* (2013.01); *H01L 2224/13113* (2013.01); *H01L 2224/13116* (2013.01); *H01L 2224/13124* (2013.01); *H01L 2224/13139* (2013.01); *H01L 2224/13144* (2013.01); *H01L 2224/13147* (2013.01); *H01L 2224/13155* (2013.01); *H01L 2224/2101* (2013.01); *H01L 2224/214* (2013.01); *H01L 2224/215* (2013.01); *H01L 2224/32225* (2013.01); *H01L 2224/73267* (2013.01); *H01L 2224/92* (2013.01); *H01L 2224/94* (2013.01); *H01L 2224/95001* (2013.01); *H01L 2224/96* (2013.01); *H01L 2924/12041* (2013.01); *H01L 2924/12042* (2013.01); *H01L 2924/13091* (2013.01); *H01L 2924/181* (2013.01); *H01L 2924/18161* (2013.01); *H01L 2924/18162* (2013.01); *H01L 2924/3511* (2013.01)

(56) References Cited

U.S. PATENT DOCUMENTS

| | | |
|---|---|---|
| 5,161,093 A | 11/1992 | Gorczyca et al. |
| 5,225,023 A | 7/1993 | Wojnarowski et al. |
| 5,353,498 A | 10/1994 | Fillion et al. |
| 5,546,654 A | 8/1996 | Wojnarowski et al. |
| 6,683,377 B1 | 1/2004 | Shim et al. |
| 6,905,914 B1 | 6/2005 | Huemoeller et al. |
| 7,192,802 B2 | 3/2007 | Stecker et al. |
| 7,192,807 B1 | 3/2007 | Huemoeller et al. |
| 7,342,303 B1 | 3/2008 | Berry et al. |
| 7,642,128 B1 | 1/2010 | Lin et al. |
| 7,692,286 B1 | 4/2010 | Huemoeller et al. |
| 7,767,496 B2 * | 8/2010 | Shim, II ............... H01L 21/568 257/E21.503 |
| 7,932,595 B1 | 4/2011 | Huemoeller et al. |
| 8,119,455 B1 | 2/2012 | Huemoeller et al. |
| 8,298,866 B1 | 10/2012 | Huemoeller et al. |
| 8,486,764 B1 | 7/2013 | Huemoeller et al. |
| 8,691,632 B1 | 4/2014 | Huemoeller et al. |
| 8,710,649 B1 | 4/2014 | Huemoeller et al. |
| 2007/0079986 A1 | 4/2007 | Kikuchi et al. |
| 2007/0152314 A1 | 7/2007 | Manepalli et al. |
| 2009/0017024 A1 | 1/2009 | Estok et al. |
| 2009/0152715 A1 | 6/2009 | Shim et al. |
| 2010/0148378 A1 | 6/2010 | Katayama et al. |
| 2010/0216280 A1 | 8/2010 | Smeys et al. |

\* cited by examiner

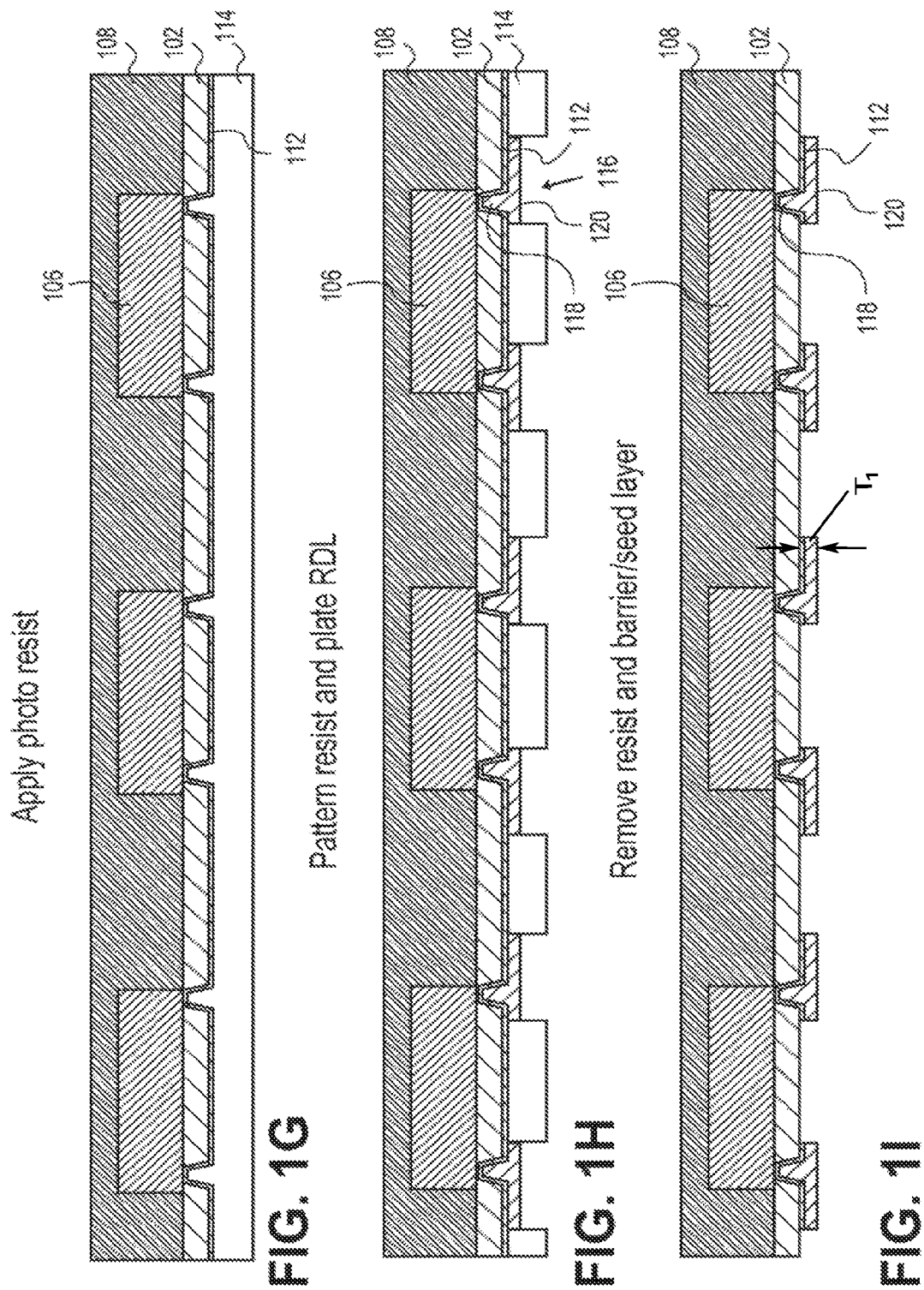

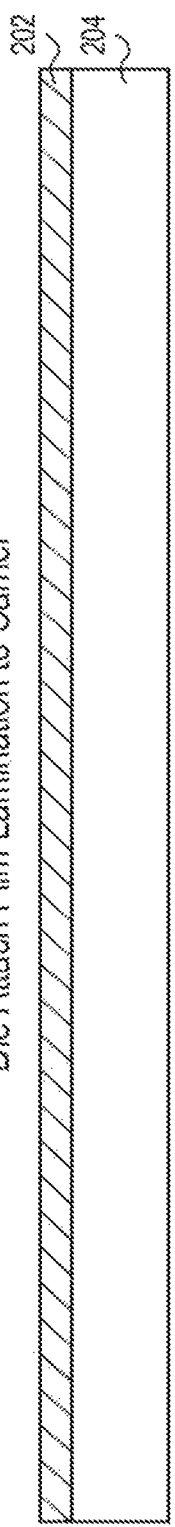
FIG. 2A Die Attach Film Lamination to Carrier
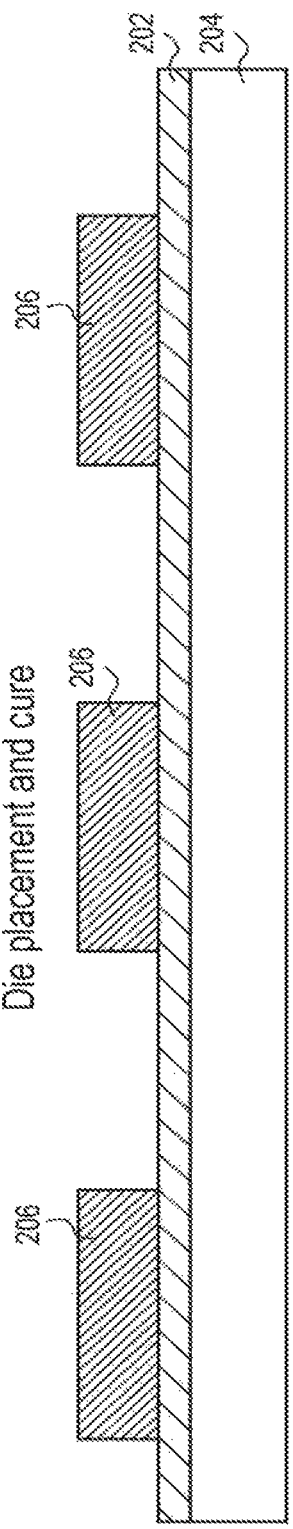
FIG. 2B Die placement and cure
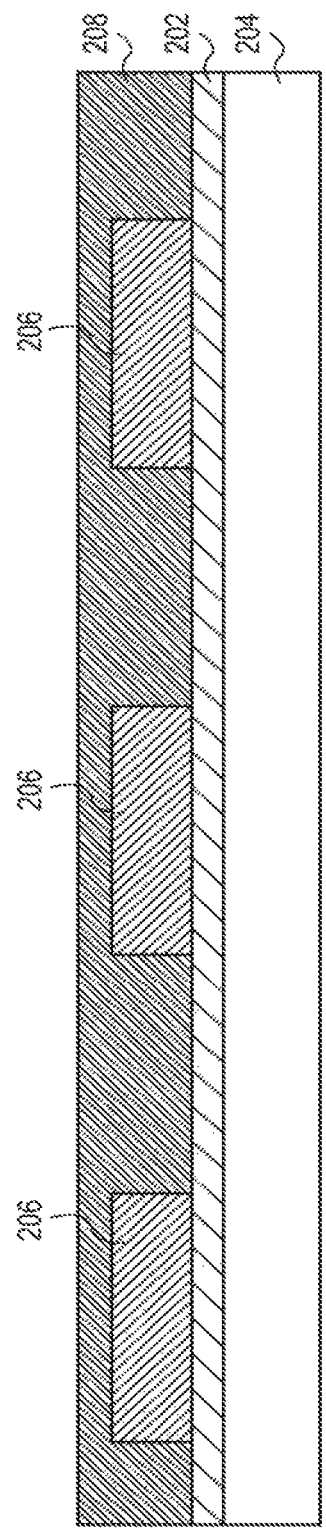
FIG. 2C Encapsulation Carrier Removal Laser Ablate Vias and Traces Seed and Plate Cu

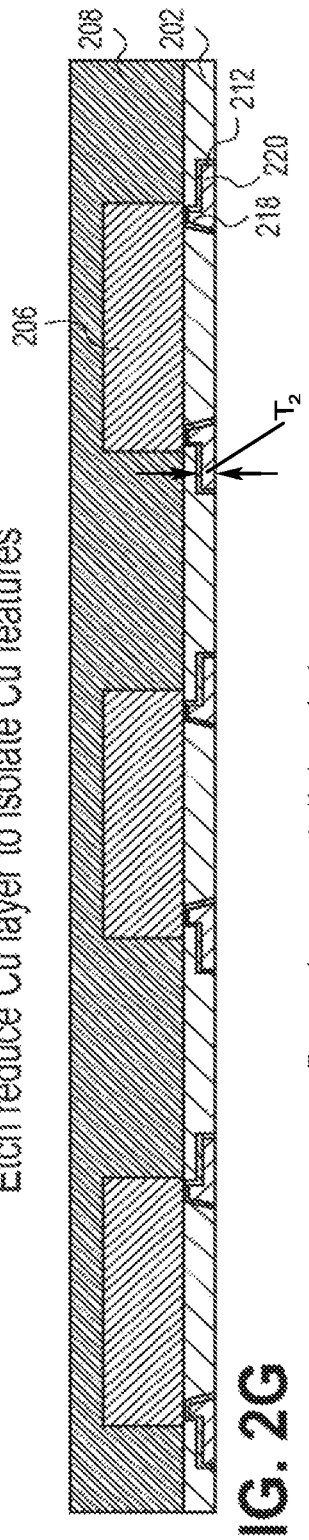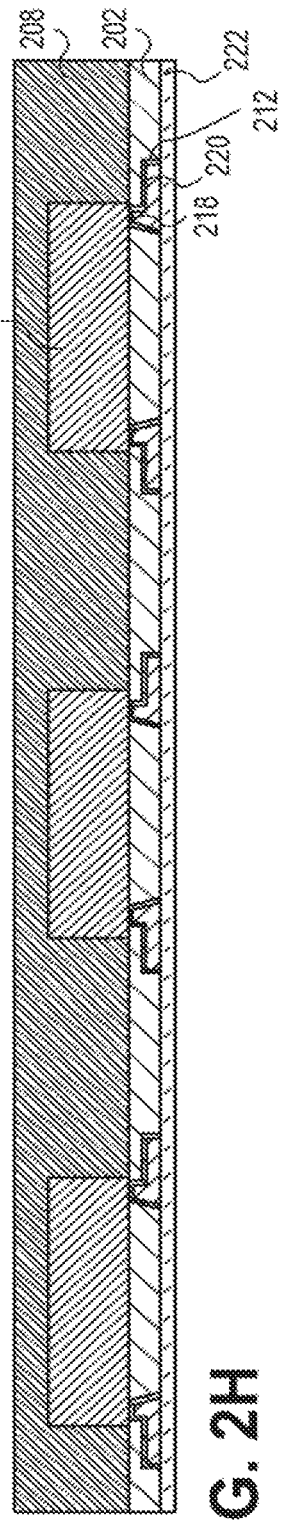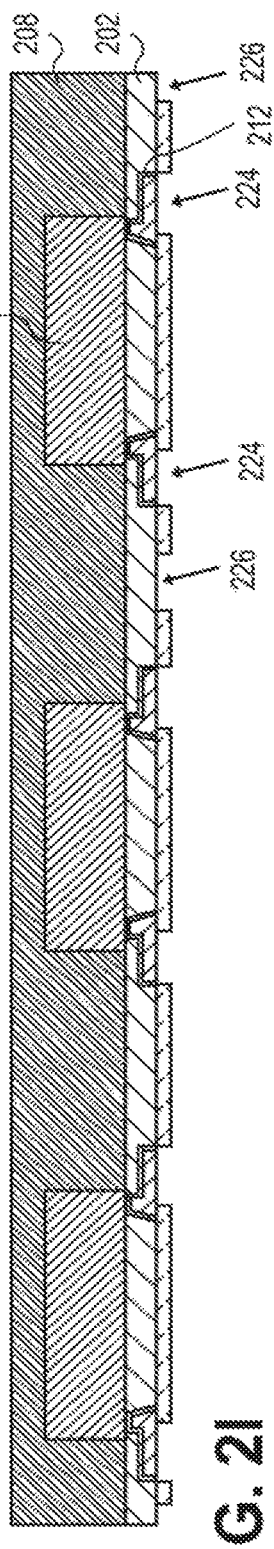

US 9,754,835 B2

SEMICONDUCTOR DEVICE AND METHOD COMPRISING REDISTRIBUTION LAYERS

RELATED APPLICATIONS

This application is a continuation in part of U.S. patent application Ser. No. 14/930,514, titled "Semiconductor Device and Method Comprising Redistribution Layers," filed Nov. 2, 2015, which is a continuation in part of U.S. application Ser. No. 14/642,531 entitled "Semiconductor Device and Method Comprising Thickened Redistribution Layers," which was filed on Mar. 9, 2015, now issued as U.S. Pat. No. 9,177,926, which application claims the benefit of U.S. Provisional Patent No. 61/950,743, entitled "Wafer-Level-Chip-Scale-Packages with Thick Redistribution Layer Traces," which was filed on Mar. 10, 2014, and further is also a continuation in part of U.S. application Ser. No. 14/584,978, entitled "Die Up Fully Molded Fan-Out Wafer Level Packaging," which was filed on Dec. 29, 2014, now issued as U.S. Pat. No. 9,337,086, which application is a continuation of U.S. application Ser. No. 14/024,928, entitled "Die Up Fully Molded Fan-Out Wafer Level Packaging," which was filed on Sep. 12, 2013, now issued as U.S. Pat. No. 8,922,021, which application claims the benefit of the filing date of U.S. Provisional Patent No. 61/672,860, entitled "Fan-Out Semiconductor Package," which was filed on Jul. 18, 2012, and further is also a continuation of U.S. application Ser. No. 13/632,062, entitled "Die Up Fully Molded Fan-Out Wafer Level Packaging," which was filed on Sep. 30, 2012, now issued as U.S. Pat. No. 8,535,978, which application is a continuation in part of U.S. application Ser. No. 13/341,654, entitled "Fully Molded Fan-Out," which was filed on Dec. 30, 2011, now issued as U.S. Pat. No. 8,604,600, the disclosures of each of which are hereby incorporated by this reference in their entireties.

This application is also a continuation in part application of U.S. patent application Ser. No. 14/261,265, titled "Panelized Packaging With Transferred Dielectric," filed Apr. 24, 2014, which is a divisional application of U.S. patent application Ser. No. 12/985,212, titled "Panelized Packaging With Transferred Dielectric," filed Jan. 5, 2011, now abandoned, and also claims the benefit of U.S. Provisional Application Ser. No. 61/305,122, filed Feb. 16, 2010, the disclosures of each of which are hereby incorporated by this reference in their entireties.

TECHNICAL FIELD

Embodiments of the present invention relate to the field of packaging semiconductor die.

BACKGROUND

Semiconductor devices are commonly found in modern electronic products. Semiconductor devices vary in the number and density of electrical components. Discrete semiconductor devices generally contain one type of electrical component, for example, light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, that is, front-end manufacturing, and back-end manufacturing, each involving potentially hundreds of steps. Front-end manufacturing involves the formation of a plurality of semiconductor die on the surface of a semiconductor wafer. Each semiconductor die is typically identical and contains circuits formed by electrically connecting active and passive components. Back-end manufacturing involves singulating individual semiconductor die from the finished wafer and packaging the die to provide structural support and environmental isolation. The term "semiconductor die" as used herein refers to both the singular and plural form of the words, and accordingly can refer to both a single semiconductor device and multiple semiconductor devices.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller semiconductor die size can be achieved by improvements in the front-end process resulting in semiconductor die with smaller, higher density, active and passive components. Back-end processes may result in semiconductor device packages with a smaller footprint by improvements in electrical interconnection and packaging materials.

A common implementation of panelized packaging gaining acceptance in industry is fan-out wafer level packaging (WLP) in which multiple semiconductor die are placed face down on a temporary tape carrier. The multiple semiconductor die and temporary tape carrier are overmolded with a molding compound using a compression molding process. After molding, the tape carrier is removed leaving the active surface of the multiple semiconductor die exposed in a structure commonly referred to as a reconstituted wafer. Subsequently, a wafer level chip scale package (WLCSP) build-up structure is formed on top of the reconstituted wafer. Ball grid array (BGA) balls are attached to the reconstituted wafer and then the reconstituted wafer is saw singulated to form individual packages. It has been observed that the die unit placement and overmolding processes may cause displacement and/or rotation of the semiconductor die, resulting in defective packages and yield loss.

SUMMARY

Accordingly, in an aspect, a method of making a plurality of semiconductor device can include placing a single layer dielectric film comprising a first surface and a second surface opposite the first surface directly on a temporary carrier substrate. The first surface and the second surface of the single layer dielectric film can be substantially parallel. A plurality of semiconductor die can be placed face down directly on the first surface of the single layer dielectric film opposite the second surface of the dielectric film attached to the temporary carrier substrate. The plurality of semiconductor die can be disposed over the temporary carrier substrate. The single layer dielectric film can be cured after placing the plurality of semiconductor die on the first surface of the single layer dielectric film to lock the plurality of semiconductor die in place on the single layer dielectric film and render the single layer dielectric film non-photoimageable. The plurality of semiconductor die can be encapsulated on the cured single layer dielectric film with an encapsulant while the temporary carrier substrate supports the single layer dielectric film and the plurality of semiconductor die. The temporary carrier substrate can be released from the cured single layer dielectric film after encapsulating the plurality of semiconductor die on the cured single layer dielectric film, and prior to patterning the cured single layer dielectric film. The cured single layer dielectric film can be patterned utilizing a mask-less patterning technique to form redistribution layer (RDL) trace pattern openings and to form a via hole that extends from the first surface of the cured single layer dielectric film to the second surface of the cured single layer dielectric film after having removed the temporary carrier substrate. A thick conductive layer comprising a thickness greater than 8 micrometers (μm) can be formed and extend over the plurality of semiconductor die and directly contacts the second surface of the patterned cured single layer dielectric film and the via hole, the conductive layer being substantially parallel to, and extending across, the second surface of the patterned cured single layer dielectric film. The plurality of semiconductor die can be singulated by cutting through the encapsulant and the cured single layer dielectric film to form individual packages.

The method of making the plurality of semiconductor packages can further comprise placing the plurality of semiconductor die on the first surface of the single layer dielectric film by placing the plurality of semiconductor die on a surface of a B-stage cured epoxy. The via holes and the RDL trace pattern openings can be formed within the single layer dielectric film using laser ablation, the RDL trace pattern openings intersecting with the via holes in the single layer dielectric film in a stair step fashion. The method can further comprise applying a photoimageable polymer layer over the patterned cured single layer dielectric film, forming a plurality of openings in the photoimageable polymer layer using a photolithographic patterning technique, and cutting through the cured single layer dielectric film and the encapsulant without cutting through the photoimageable polymer layer to singulate the plurality of semiconductor die. The thick conductive layer can be formed comprising a thickness greater than or equal to 20 μm. A composition of the encapsulant can be the same as a composition of the dielectric film. The single layer dielectric film can comprise a thickness in a range of 5-50 micrometers, a glass transition temperature (Tg) in a range of 140-190° C., and 50-90% of ceramic filler or silica filler by weight. An active surface of the plurality of semiconductor die can be placed on the first surface of the single layer dielectric film.

In another aspect, a method of making a semiconductor device can comprise placing a single layer dielectric film on a temporary carrier substrate, the single layer dielectric film comprising a first surface and a second surface opposite the first surface. A plurality of semiconductor die can be placed directly on the first surface of the single layer dielectric film opposite the second surface of the single layer dielectric film attached to the temporary carrier substrate. The single layer dielectric film can be cured after placing the plurality of semiconductor die on the first surface of the single layer dielectric film to lock the plurality of semiconductor die in place on the single layer dielectric film. The plurality of semiconductor die can be encapsulated directly on the single layer dielectric film with an encapsulant. The single layer dielectric film can be patterned utilizing a mask-less patterning technique to form a via hole that extends from the first surface of the cured single layer dielectric film to the second surface of the cured single layer dielectric film after removing the temporary carrier substrate. A conductive layer can be formed directly on, substantially parallel to, and extending across, the second surface of the patterned single layer dielectric film, within the vial hole, and over the plurality of semiconductor die.

The method of making the semiconductor packages can further comprise placing an active surface of the plurality of semiconductor die on the first surface of the single layer dielectric film. The single layer dielectric film can be laminated to the temporary carrier substrate at a temperature in a range of 100-130° C., wherein the single layer dielectric film comprises a thickness in a range of 5-50 micrometers, a glass transition temperature (Tg) in a range of 140-190° C., and further comprises 50-90% of ceramic filler or silica filler by weight. After laminating the single layer dielectric film to the temporary carrier, placing the plurality of semiconductor die directly on the first surface of the single layer dielectric film, and curing the single layer dielectric film at a temperature greater than the glass transition temperature (Tg) of the single layer dielectric film. Laser ablation can be used to form the via hole comprising a first depth and RDL trace pattern openings comprising a second depth less than the first depth to intersect with the via hole in the single layer dielectric film. The conductive layer can be formed as a thick RDL trace comprising a thickness greater than or equal to 20 μm. The plurality of semiconductor die can be formed with thick RDL traces formed while the plurality of semiconductor die is part of a native wafer, and the plurality of semiconductor die can be placed directly on the first surface of the single layer dielectric film with the thick RDLs directly contacting the first surface of the single layer dielectric film.

In another aspect, the a method of making a semiconductor device can comprise placing a single layer dielectric film on a temporary carrier substrate, the single layer dielectric film comprising a first surface and a second surface opposite the first surface. A plurality of semiconductor die can be placed directly on the first surface of the single layer dielectric film with the plurality of semiconductor die disposed over the temporary carrier substrate. The single layer dielectric film can be cured after placing the plurality of semiconductor die on the surface of the single layer dielectric film. The plurality of semiconductor die can be encapsulated on the single layer dielectric film with an encapsulant while the temporary carrier substrate supports the single layer dielectric film and the plurality of semiconductor die. The single layer dielectric film can be patterned and leave a portion of the single layer dielectric film disposed over an active surface of the plurality of semiconductor die. A conductive layer can be formed directly on, and extend across, the second surface of the patterned single layer dielectric film and over the plurality of semiconductor die.

The method of making the plurality of semiconductor packages can further comprise forming a composition of the encapsulant the same as a composition of the single layer dielectric film. A conductive layer can be formed directly on a surface of the patterned single layer dielectric film. The single layer dielectric film can comprise a thickness in a range of 5-50 micrometers, a glass transition temperature (Tg) in a range of 140-190° C., and further comprises 50-90% of ceramic filler or silica filler by weight. Laser ablation can be used to form both vias and a redistribution layer trace pattern openings in within the single layer dielectric film, the RDL trace pattern intersecting with the vias in the single layer dielectric film in a stair step fashion. The conductive layer can comprise a thick redistribution layer comprising a thickness greater than or equal to 20 μm.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

FIGS. 2A-2L illustrate an aspect of a method of forming a fan-out WLP.

DETAILED DESCRIPTION

Figure 1A:
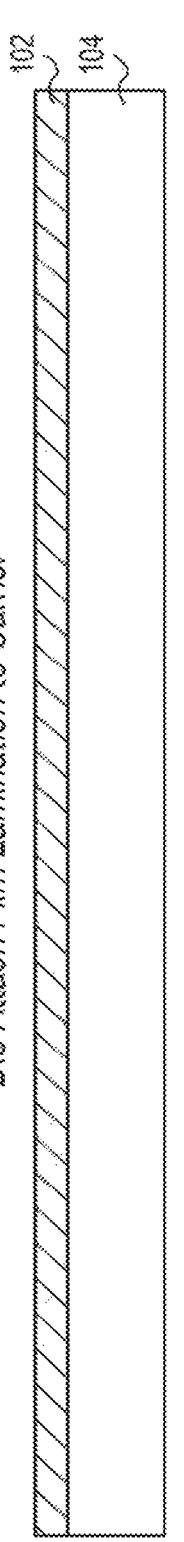
FIGS. 1A-1N illustrate an aspect of a method of forming a fan-out WLP.

The present disclosure includes one or more embodiments in the following description with reference to the figures, in which like numerals represent the same or similar elements. It will be appreciated by those skilled in the art that the description is intended to cover alternatives, modifications, and equivalents as may be included within the spirit and scope of the disclosure as defined by the appended claims and their equivalents as supported by the following disclosure and drawings.

In the following description, numerous specific details are set forth, such as specific configurations, compositions, and processes, etc., in order to provide a thorough understanding of the disclosure. In other instances, well-known processes and manufacturing techniques have not been described in particular detail in order to not unnecessarily obscure the disclosure. Furthermore, the various embodiments shown in the FIGs. are illustrative representations and are not necessarily drawn to scale.

Embodiments of the present invention disclose methods and structures to improve panelized packaging, such as fan-out WLCSP. In the following description, specific embodiments are described with regard to single die applications. Embodiments of the present invention may also be useful in multi-die modules or some combination of die and passive components (such as a capacitor, inductor or resistor) and/or other components (such as an optical element, connector or other electronic component) within modules.

In the following description, numerous specific details are set forth, such as specific configurations, compositions, and processes, etc., in order to provide a thorough understanding of the present invention. In other instances, well-known processes and manufacturing techniques have not been described in particular detail in order to not unnecessarily obscure the present invention. Furthermore, it is to be understood that the various embodiments shown in the Figures are illustrative representations and are not necessarily drawn to scale.

The terms over, "between" and "on" as used herein refer to a relative position of one layer with respect to other layers. One layer deposited or disposed over or under another layer may be directly in contact with the other layer or may have one or more intervening layers. One layer deposited or disposed between layers may be directly in contact with the layers or may have one or more intervening layers. In contrast, a first layer "on" a second layer is in contact with that second layer.

In an embodiment, a panelized package is created by placing a plurality of semiconductor die face down on a dielectric film, which may be laminated on a temporary carrier substrate. The dielectric film is then cured to lock the plurality of semiconductor die in place, rendering the dielectric film non-photoimageable. During cure changes occur at the molecular level in the dielectric film material where the mechanical properties of the dielectric film substantially fully develop and the semiconductor die permanently adhere to the resultant rigid dielectric film. Depending upon the particular materials employed curing may be associated with cross-linking. The plurality of semiconductor die are then encapsulated on the dielectric film. In an embodiment, encapsulation may be achieved by an overmolding process such as compression molding. In an embodiment, encapsulation may be performed by a lamination process such as vacuum lamination. Because the plurality of semiconductor die have been locked into place prior to encapsulation, displacement and/or rotation of the individual semiconductor die may be reduced during encapsulation where displacement and/or rotation of the individual semiconductor die can be problematic due to pressures exerted on the individual semiconductor die. The temporary carrier substrate may then be released from the dielectric film. A wafer level chip scale package (WLCSP) build-up structure may then be formed including the rigid, cured, continuous dielectric film which may be patterned utilizing a mask-less patterning technique.

It has been observed that die unit placement and encapsulation processes of conventional processing technologies may cause displacement and/or rotation of the orientation of any of the plurality of semiconductor die on a temporary tape carrier. This may be attributed to the semiconductor die not being rigidly attached to the temporary tape carrier, deformation of the tape carrier, as well as shrinkage of the encapsulant during curing of the encapsulant. The impact of conventional methods utilizing a temporary tape carrier is either yield loss due to misalignment of first vias to the die unit bond pads, or the addition of some intermediate form of bond pad re-routing in native wafer form (prior to panelization) to make large bond pads as targets to ensure the first vias make connection despite die unit movement. As a result, conventional processing technology requires that bond pads on the semiconductor die be larger than necessary to avoid yield loss from the panel, thereby reducing the application space for WLP technology.

In accordance with embodiments of the present invention, a continuous dielectric film, such as a laminated epoxy film, can replace both the temporary, sacrificial tape and the first dielectric layer in the build-up structure. This has the potential to reduce cost and process steps. Locking the plurality of semiconductor die in place on the continuous dielectric film prior to encapsulation may reduce displacement and/or rotation of the orientation of the individual semiconductor die within a panel or reticulated wafer thereby eliminating or reducing package assembly yield loss caused by misalignment of the semiconductor die during panelization and allowing for a smaller bond pad opening on the semiconductor die. Epoxy is a suitable material from which to form the dielectric film because it may be cured to lock the plurality of semiconductor die in place, and also because a similar epoxy can be utilized as an overmolding or lamination encapsulant. Other materials having suitable adhesive properties for locking the plurality of semiconductor die in place are also contemplated with embodiments of the invention such as, but not limited to, polyimide and silicone.

In another aspect, embodiments of the present invention disclose methods of panelized packaging which may utilize lamination techniques. For example, lamination may provide for uniform thickness of a laminated dielectric film across a temporary carrier substrate. A laminated dielectric film may also be subsequently removable from the temporary carrier substrate. In a particular embodiment, a B-stage cured dielectric film material such as a B-stage cured epoxy material is laminated onto the temporary carrier substrate. A B-stage cured material is commonly one in which a limited reaction between a resin and hardener has taken place so that the material is in a solid state with partially developed network (semi-cured). In this state, the B-stage cured material may still be fusible. The B-stage cured material may be final cured by additional exposure to heat and/or radiation, where the network may become fully developed (e.g. cross-linked), rigid and non-photoimageable. Final curing may also be accompanied by moderate flow.

Such a B-stage cured dielectric film material may retain adhesive properties (tack) that assist with retaining the location of the plurality of semiconductor die during placement of the plurality of semiconductor die on the dielectric film, and experiences only moderate flow during final cure to lock the plurality of semiconductor die in place. As a result, the laminated dielectric film formed from a B-stage cured material may exhibit desirable planarity after across the panel after cure. Additionally, as a result of the planarity of the dielectric film surface upon which the plurality of semiconductor die are placed, a discontinuity does not exist in the dielectric film adjacent the edges of the semiconductor die. Accordingly, the active surfaces of the semiconductor die and the dielectric film surface upon which the due units are placed are both in the same plane which may be beneficial for device reliability metrics such as delamination during moisture sensitivity testing, or mounting to a motherboard or other product.

Lamination may also be utilized to encapsulate the plurality of semiconductor die on the dielectric film. For example, vacuum encapsulation can be utilized with a B-stage cured epoxy of similar or identical composition as the dielectric film. As a result, the physical properties such as coefficient of thermal expansion (CTE), hardness and elastic modulus or weight percent of filler in the laminated encapsulant layer and the dielectric film can be closely matched or identical, thereby improving the integrity of the final packages. In addition, singulation of packages having similar or identical compositions for the dielectric film and encapsulant may be associated with reduced chipping or delamination between layers.

FIGS. 1A-1N and FIGS. 2A-2L illustrate methods for forming a fan-out WLCSP in which a permanent dielectric film 102 is patterned during the formation of alternative build-up structures in accordance with various embodiments. FIGS. 1A-1N illustrate an embodiment in which a RDL trace 120 of the build-up structure is formed over the dielectric film 102. FIGS. 2A-2L illustrate an embodiment in which a RDL trace of the build-up structure is formed within the dielectric film. Various modifications and changes may be made to the particular build-up structures illustrated including, but not limited to, build-up structures with multiple dielectric layers and device interconnect traces, which may or may not be associated with the RDL traces. Such multi-layer build-up structures can be utilized in both single-die package applications as well as multi-device modules. Accordingly, the specific embodiments illustrated in FIGS. 1A-1N and FIGS. 2A-2L are to be regarded in an illustrative sense rather than a restrictive sense.

Referring to FIG. 1A, in an embodiment, the process begins with attaching a dielectric film 102 to a temporary carrier substrate 104. In an embodiment, the dielectric film 102 is laminated to the temporary carrier substrate 104. Such a laminated dielectric film 102 may be uniformly applied across the temporary carrier substrate 104 and also be readily releasable from the temporary carrier substrate 104 at a later stage. For example, lamination can be performed by rolling under heat and pressure. Other methods of attaching the dielectric film 102 to the temporary carrier substrate 104 are also contemplated such as spin coating, printing, and spraying.

In an embodiment, the dielectric film 102 is formed of a material such as an epoxy, polyimide or silicone in which the mechanical properties of the material are substantially full developed by curing. Dielectric film 102 may be formed of a printed circuit board (PCB) prepreg material. For example, dielectric film 102 may be formed of a partially cured, B-stage cured epoxy, and may include additional filler(s). In an embodiment, it is possible to laminate the dielectric film 102 at temperatures significantly below the glass transition temperature (Tg) of the resultant fully cured dielectric film 102. For example, a dielectric film 102 including a B-stage cured epoxy having a resultant film Tg of approximately 140-190° C. can be vacuum laminated at approximately 100-130° C. Dielectric film 102 may be opaque, or alternatively at least partially translucent. Temporary carrier substrate 104 may be formed of a variety of materials such as, but not limited to, steel, glass, and sapphire which are rigid enough not to move during a subsequent molding operation, and releasable from dielectric film 102 after the molding operation. In an embodiment, the dielectric film is 5 to 50 microns thick, and the temporary carrier substrate 104 is approximately 2 mm thick.

The dielectric film 102 can comprise a first surface and a second surface opposite the first surface, the first and second surfaces being substantially parallel. As used herein, substantially parallel can mean that the first surface and the second surface vary by an angle less than 20 degrees, 10, degrees, 5 degrees, or 1 degree. Substantially parallel can also mean the opposing first and second surfaces vary by a thickness, offset, or distance less than or equal to 20 percent, 10, percent, 5 percent, or 1 percent of the thickness, offset, or distance, along a length, width, or both length and width of the first and second surfaces of the dielectric film 102.

Figure 1B:
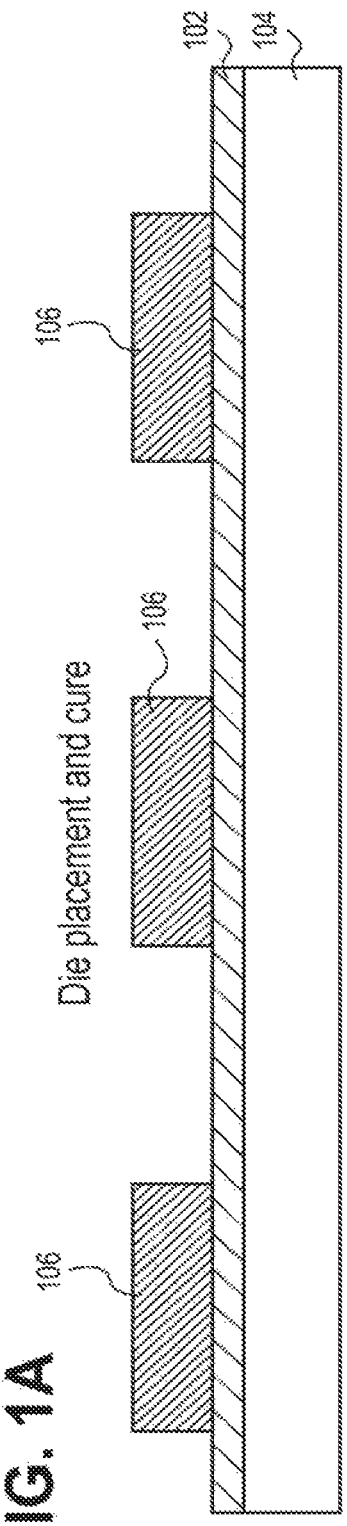

Referring to FIG. 1B, a plurality of semiconductor die, die units, or components 106 may be placed on a surface of dielectric film 102, for example, by utilizing a pick and place die attach machine, and the dielectric film 102 may be cured to lock the plurality of semiconductor die 106 into place on the cured, rigid dielectric film 102, which may be rendered non-photoimageable by the curing process. Curing may be performed during or after placement and may be performed by a variety of method such as thermal, ultraviolet (UV), or microwave curing cycles until the dielectric film 102 is rigid and substantially cross-linked. In an embodiment, dielectric film 102 includes a B-stage epoxy material, and is final cured at temperature sufficient to fully cross-link the material, typically above the resultant Tg of the final cured dielectric film 102. For example, a dielectric film including a B-stage epoxy having a final cured Tg of approximately 140-160° C. may be cured at approximately 170° C. In an embodiment, dielectric film 102 has a final cured Tg greater than or equal to 190° C. In an embodiment, the dielectric film 102 includes greater than 50%, by weight, of a particulate ceramic filler such as silica. In an embodiment, the dielectric film 102 includes 60-90%, by weight, ceramic filler. In an embodiment, the dielectric film 102 may have a CTE of 11-18 ppm/° C. at room temperature, such as approximately 12 ppm/° C. at room temperature. In an embodiment, curing achieves enough adhesion between the dielectric film 102 and plurality of semiconductor die 106 to meet first level package reliability metrics such as delamination during moisture sensitivity testing, or mounting to a motherboard or other product.

Figure 1C:
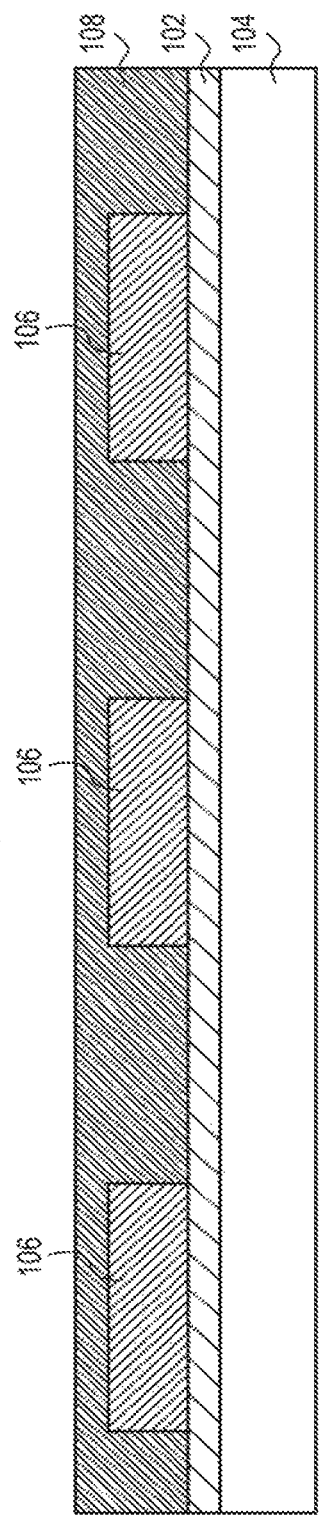

After curing the dielectric film 102, the plurality of semiconductor die 106 on the dielectric film 102 are encapsulated with an encapsulant layer 108 as illustrated in FIG. 1C such that the plurality of semiconductor die 106 are encapsulated by the encapsulant layer 108 and dielectric film 102. During encapsulation, the temporary carrier substrate 104 prevents flexing or movement of the cured dielectric film 102, and the cured dielectric film 102 holds the plurality of individual semiconductor die 106 in place, thereby improving alignment within the panel or reticulated wafer. As illustrated in FIG. 1C, in an embodiment, the active surfaces of the plurality of semiconductor die 106 are substantially flush with the surface of the encapsulant layer 108 on dielectric film 102.

In an embodiment, encapsulation is performed by an overmolding process such as compression molding with a molding compound. The molding compound may be a powder including epoxy resin and filler(s). For example, compression molding may be performed at approximately 170° C. to completely melt a powder epoxy resin included in an encapsulant layer 108 having a final Tg of approximately 140-160° C. In an embodiment, the molding compound includes greater than 50%, by weight, of a particulate ceramic filler such as silica. In an embodiment, the molding compound includes 60-90%, by weight, ceramic filler. In an embodiment, the final cured molding compound may have a CTE of 11-18 ppm/° C. at room temperature, such as approximately 12 ppm/° C. at room temperature. It is also contemplated that overmolding in accordance with embodiments of the invention can be accomplished with other methods such as liquid epoxy molding, transfer molding, screen printing, and injection molding.

In an embodiment, encapsulation is performed by vacuum lamination in which final curing may be performed during or after lamination. Similar to dielectric film 102, encapsulant layer 108 can include a B-stage cured material and additional filler(s). In an embodiment, dielectric film 102 and encapsulant layer 108 may be formed of identical materials or materials having similar physical properties. Lamination of encapsulant layer 108 may allow for the use of a printed circuit board (PCB) prepreg material sheet, and may be relatively lower cost than injection molding materials. Lamination performed under heat and vacuum can take advantage of the fusible (compliant) nature of a B-stage cured material to encapsulate the plurality of semiconductor die 106. In addition, because an encapsulant layer 108 component is B-stage cured it is possible to encapsulate at a temperature well below the final cured Tg of the encapsulant layer 108, and to perform final curing after the encapsulant layer 108 has been formed/shaped around the plurality of semiconductor die 106. In an embodiment, lamination may include placing a semi-cured encapsulant film (e.g. including B-stage cured epoxy) over the plurality of semiconductor die 106 on the cured dielectric film 102 and applying heat and pressure under vacuum to the semi-cured encapsulant film to form/shape encapsulant layer 108. For example, lamination may be performed at approximately 130° C. and 30 kg/cm² for an encapsulant layer 108 having a final cured Tg of approximately 140-215° C. In an embodiment, laminated encapsulant layer 108 is formed of a material having a final cured Tg greater than or equal to 190° C. In an embodiment, the lamination film includes greater than 50%, by weight, such as 60-90% of a particulate ceramic filler such as silica. In an embodiment, the final cured laminated encapsulant layer 108 may have a CTE of 11-18 ppm/T at room temperature, such as approximately 12 ppm/° C. at room temperature. Final curing may subsequently be performed after lamination at a temperature sufficient to fully cross-link the encapsulant material, typically above the resultant Tg of the final cured encapsulant layer 108.

Figure 1D:
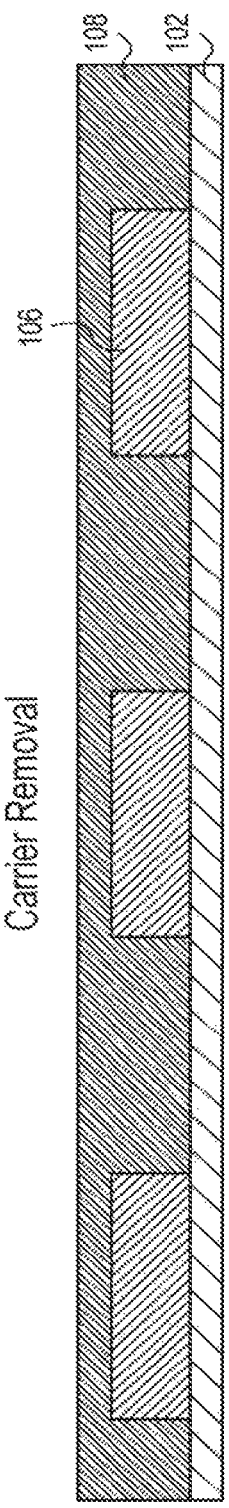

The temporary carrier substrate 104 may then be released from the dielectric film 102 as illustrated in FIG. 1D, leaving the dielectric film 102 attached to what is commonly referred to as a panel or reconstituted wafer including the plurality of semiconductor die 106 and encapsulant 108. Releasing may be accomplished by a variety of techniques such as UV irradiation, peeling, laser release, etching, and grinding. As such, the permanent dielectric film 102 may be permanent in the sense that instead of being removed from the panel or reconstituted wafer with the temporary carrier substrate 104, a portion or majority of the permanent dielectric film 102 may be incorporated as a permanent part of the final semiconductor device structure. As discussed in greater detail below, portions of the permanent dielectric film 102 can be removed to form openings through the permanent dielectric film, such as for electrical interconnection, and still be considered permanent for purposes of this description.

Figure 1E:
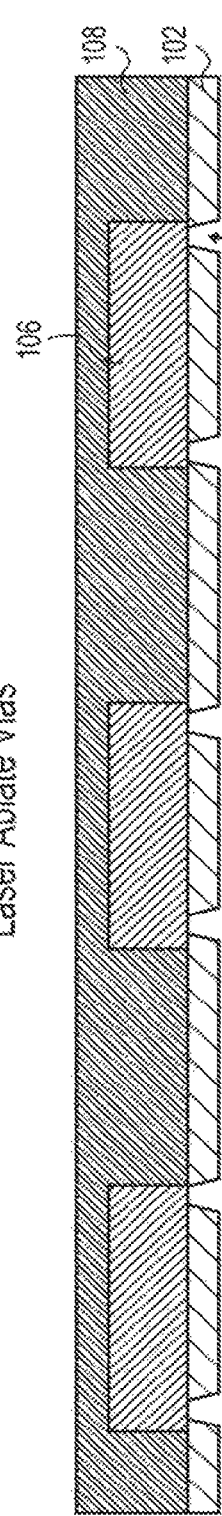

Referring to FIG. 1E, first level via holes 110 may then be formed in the permanent dielectric film 102 utilizing a mask-less patterning technique such as laser ablation. In an embodiment, the formation of first level via holes 110 exposes a bond pad (not illustrated in FIG. 1, but similar to bond pad 32) formed on semiconductor die 106. First level via holes 110 may have a diameter of approximately 25 to 50 microns, for example. In one embodiment, dielectric film 102 is at least partially translucent. In accordance with embodiments of the present invention, an optical inspection operation may optionally be performed to measure the true location of any or all semiconductor die 106 after removal of the temporary carrier substrate 104 in FIG. 1D and prior to the formation of the first level via holes 110 illustrated in FIG. 1E. If the true location does not match a nominal, reference location, then the x-y position and/or orientation of the first level via holes 110, or any of the other features in the build-up structure, may be adjusted for any of the individual semiconductor die 106 as described in co-pending U.S. patent application Ser. No. 12/876,915, incorporated herein by reference.

The via holes 110 can extend completely through the dielectric layer 102, between the first surface and the second surface of the transfer dielectric (such as surfaces 102a and 102b). A slope of the sidewalls of the via holes 110 can be perpendicular, or at a 90 degree angle with respect to the first surface, the second surface, or both the first and second surface of the transfer dielectric 102. The slope of the sidewalls of the via holes 110 can also be any other suitable angle that intersects with, and is not parallel to, the first and second opposing surfaces of the transfer dielectric 102. The slope of the sidewalls of the via holes 110 can be angled, sloped, linear, quadratic, organic, geometric, constant, or vary along a height or depth of the via holes 110.

Figure 1F:
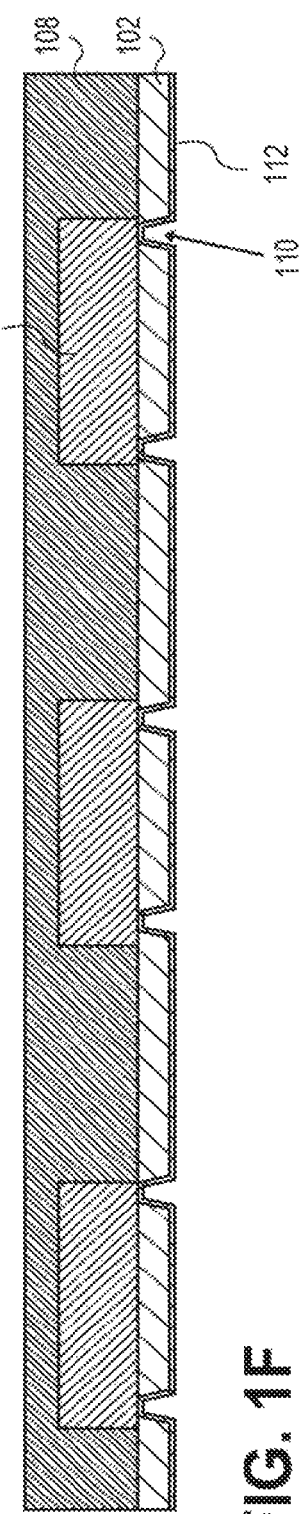

A barrier and/or seed layer 112 may then be formed over the entire surface and within first level via holes 110 as illustrated in FIG. 1F. For example, layer 112 may include a Ti, Ti/W or Ti/TiN bi-layer barrier layer of approximately 500 to 1,500 angstroms thick, and a copper seed layer of approximately 1,500 to 4,000 angstroms thick. In an embodiment, layer 112 may be formed by sputtering. In some instances, the layer 112 can be omitted, or combined with first level via metal 118 or RDL 218 so that the RDL 218 directly contacts the dielectric film 102.

Referring to FIG. 1G, a photoresist layer 114 may then be formed over layer 112 by a suitable method such as laminating or spin coating. Photoresist layer 114 may then be patterned to form RDL trace pattern openings 116 as illustrated in FIG. 1H. Plating may then follow to fill the openings 110, 116 with the first level via metal 118 and RDL trace 120, respectively, which may be in electrical communication with the active surface of the semiconductor die 106. In some instances, the seed layer 112 may be omitted, or considered as part of the RDL traces 120 such that the RDL traces 120 can be formed directly contacting the permanent dielectric film 102. In some instances RDL traces 120 may be one or more layers of Al, Cu, Sn, Ni, Au, Ag, or other suitable electrically conductive material, and can include one or more of a seed layer, adhesion layer, or barrier layer. The deposition of conductive layers or RDL traces 120 can use PVD, CVD, electrolytic plating, electroless plating, or other suitable process, and can be in direct contact with a top or second surface of the dielectric film 102 opposite the first surface of the dielectric film 102 that contacts the temporary carrier. In an embodiment, the first level via metal 118 and RDL trace 120 are copper. In any event, the conductive RDL 120 may be greater than or equal to 2 micrometers (µm) thick. Additionally, the RDL 120 may be formed as a thick RDL or RDL trace, comprising a thickness greater than, or greater a or equal to, 4 µm, 8 µm, 12 µm, 16 µm, or 20 µm. Patterned photoresist 114 and underlying portions of barrier/seed layer 112 are then removed as illustrated in FIG. 1I. Removal of barrier/seed layer 112 may also slightly reduce the thickness of the plated layer 120.

Figure 1J:
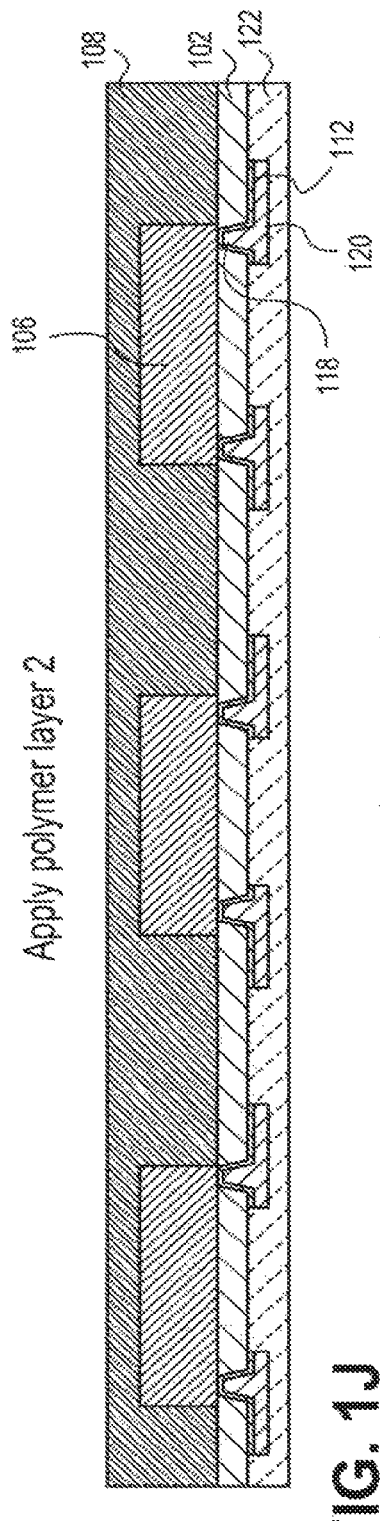
Figure 1K:
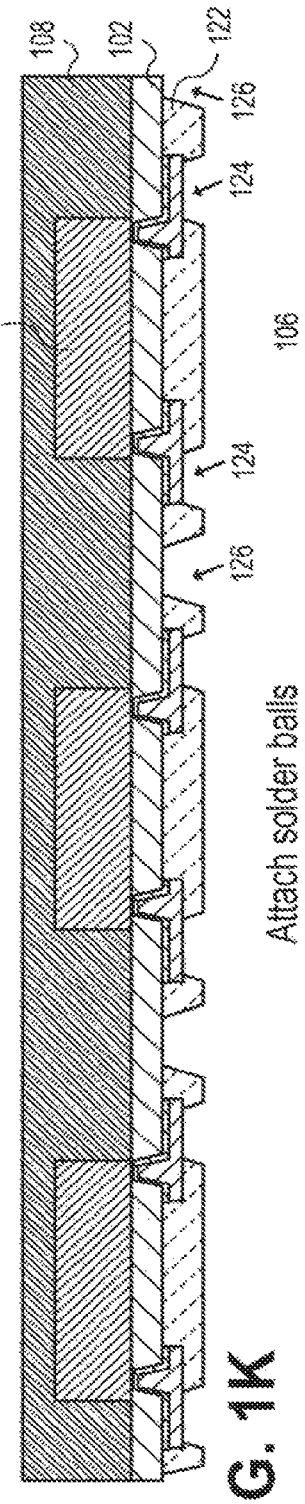

Referring to FIG. 1J, a second polymer layer 122 is formed over the patterned dielectric film 102 and RDL traces 120. In an embodiment, the second polymer layer 122 is formed from a photoimageable material such as polyimide, benzocylobutene (BCB), polybenzoxazole (PBO), etc. The second polymer layer 122 may then be patterned to form openings 124 to expose RDL traces 120 as illustrated in FIG. 1K. Openings 126 may also be formed to expose portions of dielectric film 102 to assist in singulation. Patterning of openings 124, 126 may be performed utilizing suitable photolithographic techniques. Layer 122 is not limited to polymer materials, and may be formed of other materials having suitable dielectric and sealing properties.

Figure 1L:
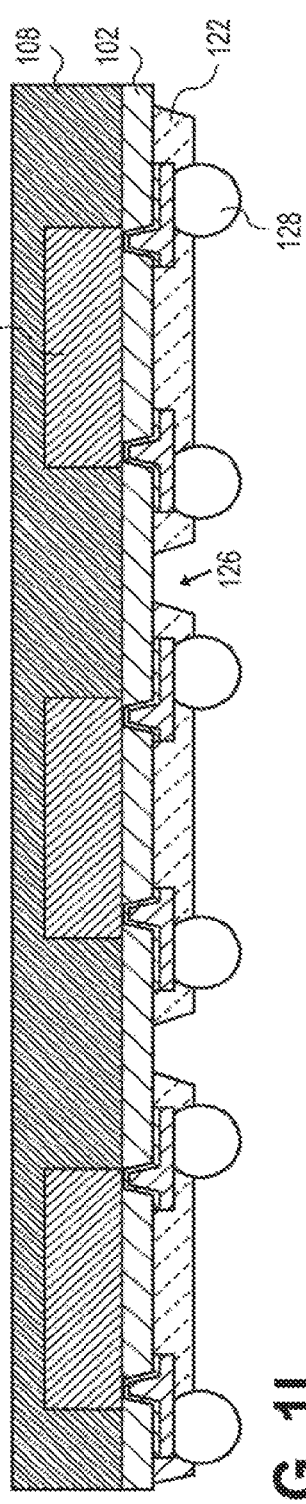

As illustrated in FIG. 1L, bumps or balls 128 may then be applied over the exposed portions of the RDL traces 120. More specifically, an electrically conductive bump material can be deposited over, and in direct contact with RDL traces 120, or a UBM pad. An electrically conductive bump material can be deposited using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to RDL traces 120 using a suitable attachment or bonding process. In an embodiment, the bump material is reflowed by heating the material above its melting point to form spherical balls or bumps 128. In some applications, bumps 128 are reflowed a second time to improve electrical contact to RDL traces 120. Bumps 128 can also be compression bonded to RDL traces 120. Bumps 128 represent one type of interconnect structure that can be formed over RDL traces 120. Other interconnect structures can also be used, including conductive paste, stud bump, micro bump, or other electrical interconnect.

Figure 1M:
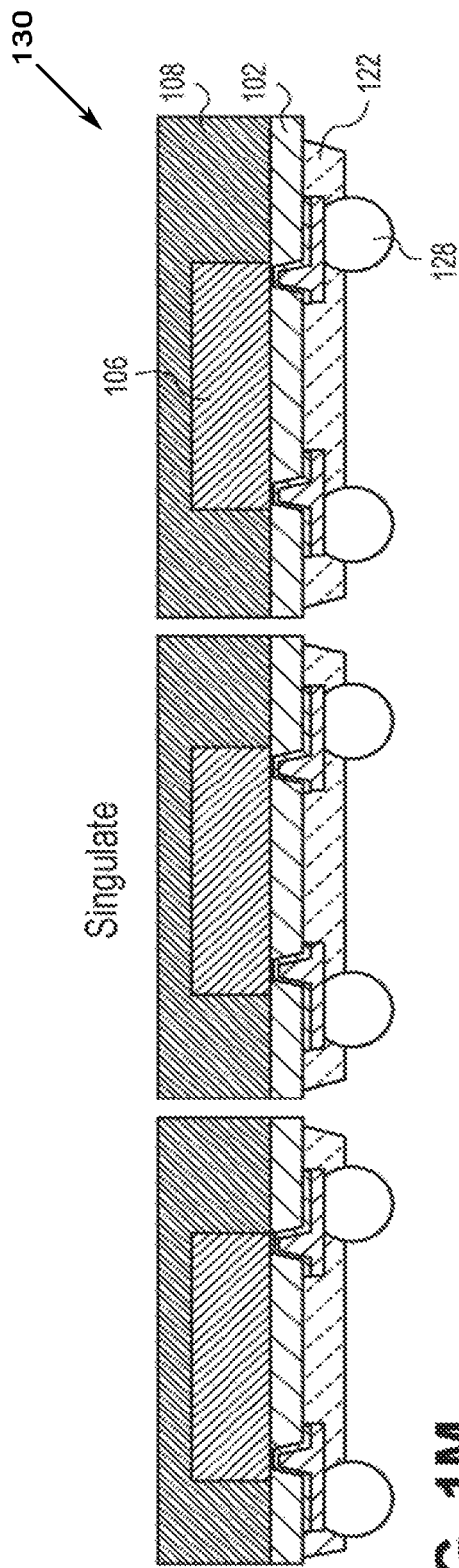
Figure 1N:
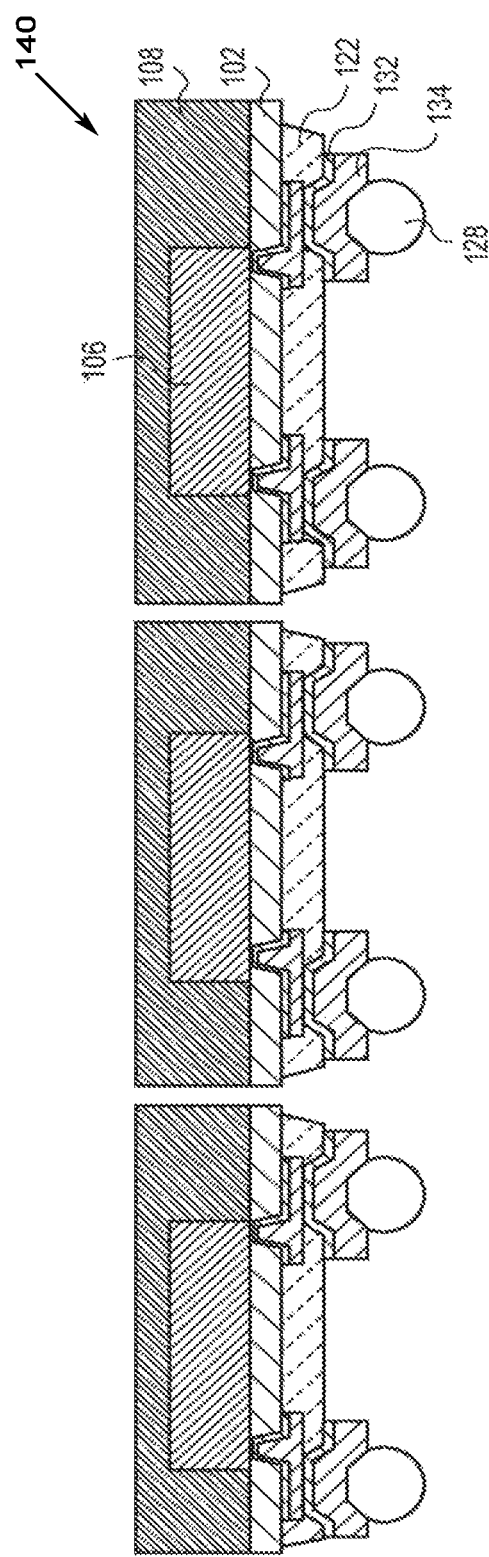

Referring to FIG. 1M, individual packages may then be singulated. As illustrated in FIG. 1M, singulation may include cutting of only the dielectric film 102 and encapsulant 108, where lateral edges of the second polymer layer 122 do not extend to, and are not flush with the lateral edges of dielectric film 102 and encapsulant 108 for the individual packages. Such a structure may be associated with reduced chipping and/or delamination between layers during singulation. In an embodiment where the encapsulant 108 and die bonding film 102 are both formed from an epoxy material, and second polymer layer 122 is formed of a polyimide, cutting during singulation is only required to be made through layers of similar composition, characteristics and therefore chipping and/or delamination is reduced.

It is understood that additional layers may be formed such as ball grid array capture pads prior to applying solder balls 128. For example, as illustrated in FIG. 1N the processes of FIGS. 1G-1H may be repeated to form barrier/seed layer 132 and ball grid array capture pads 134 prior to attaching solder balls 128. Similarly, additional conductive layers or RDLs and insulating layers a can be formed as part of a build-up interconnect structure to provide desired routing between the semiconductor die 106 and points outside the semiconductor die 106.

Referring to FIGS. 2A-2L, in a second embodiment, an alternative WLCSP build-up structure can be formed. As illustrated in FIGS. 2A-2D, a dielectric film or permanent dielectric 202 may be laminated to a temporary carrier substrate 204. A plurality of semiconductor die 206 is attached to dielectric film 202. Dielectric film 202 is then cured to lock the plurality of semiconductor die 206 into place. The plurality of semiconductor die 206 are then overmolded or laminated with an encapsulant 208. The temporary carrier substrate 204 is then removed.

Figure 2D:
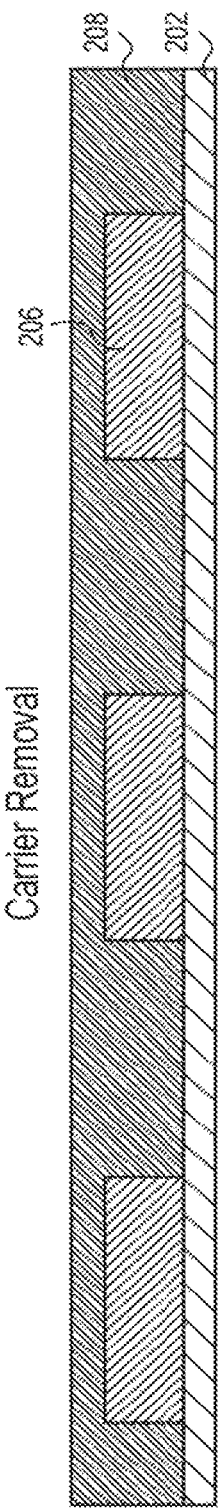
Figure 2E:
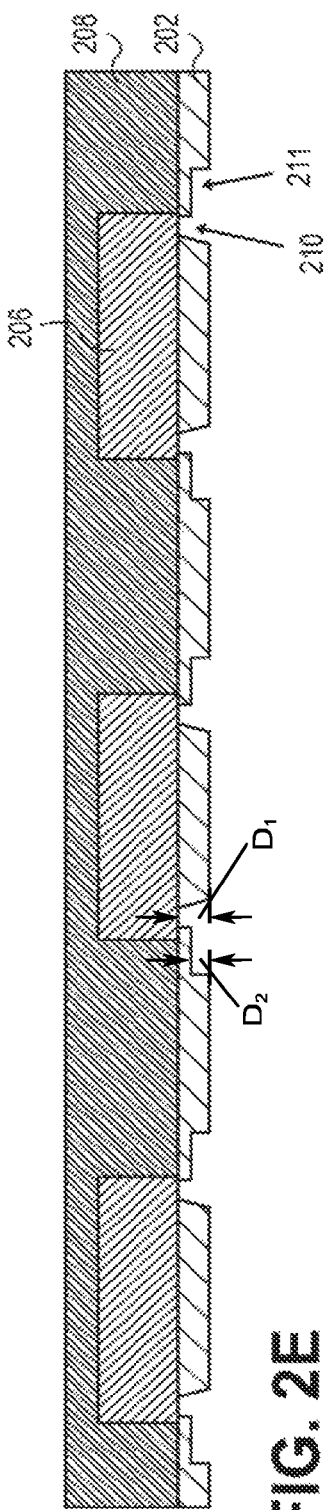

Referring to FIG. 2E, first level via holes 210 and RDL trace patterns or trace pattern openings 211 may be formed in the dielectric film 202 utilizing a mask-less patterning technique such as laser ablation. The mask-less patterning technique, such as laser ablation, can form the via holes 210 comprising a first depth $D_1$ and the RDL trace pattern openings comprising a second depth $D_2$ that is less than the first depth $D_1$. Thus, the RDL trace pattern openings 211 may intersect with the vias holes 210 in the single layer dielectric film 202 in a stair step fashion, the via holes 210 and the dielectric film 202 intersecting in the dielectric film 202 between the first surface of the dielectric film contacting the semiconductor die 206 and the second surface of the dielectric film opposite the first surface.

In one embodiment, dielectric film 202 is at least partially translucent. In accordance with embodiments of the present invention, an optical inspection operation may optionally be performed to measure the true location of any or all semiconductor die 206 after removal of the temporary carrier substrate 204 in FIG. 2D and prior to the formation of the first level via holes 210 and RDL trace pattern 211 illustrated in FIG. 2E. If the true location does not match a nominal, reference location, then the x-y position and/or orientation of the first level via holes 210, or any of the other features in the build-up structure, may be adjusted for any of the individual semiconductor die as described in co-pending U.S. patent application Ser. No. 12/876,915, incorporated herein by reference.

Figure 2F:
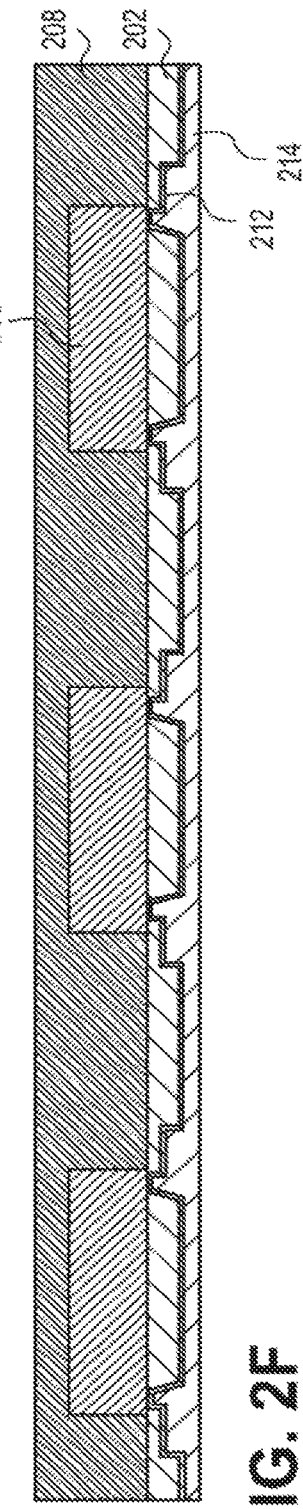

A barrier and/or seed layer 212 may be formed following by plating of a metallic layer 214 such as copper, which may then be etched back to isolate first level vias 218 and RDL traces 220 within the dielectric film 202 as illustrated in FIGS. 2F-2G. The RDL traces 220 can be formed comprising a thickness of 2 μm. Additionally, the RDL 120 may be formed as a thick RDL or RDL trace, comprising a thickness greater than, or greater than or equal to, 4 μm, 8 μm, 12 μm, 16 μm, or 20 μm. In some instances, the seed layer 212 can be omitted, or considered as part of the RDL traces 220 such that the RDL traces 220 can be formed directly contacting the permanent dielectric film 202. In some instances RDL traces 220, like RDL traces 120, can be one or more layers of Al, Cu, Sn, Ni, Au, Ag, or other suitable electrically conductive material, and can include one or more of a seed layer, adhesion layer, or barrier layer. The deposition of conductive layers or RDL traces 120 and 220 can use PVD, CVD, electrolytic plating, electroless plating, or other suitable process, and can be in direct contact with a top or second surface of the dielectric film 202 opposite the first surface of the dielectric film 202 that contacts the temporary carrier.

Figure 2J:
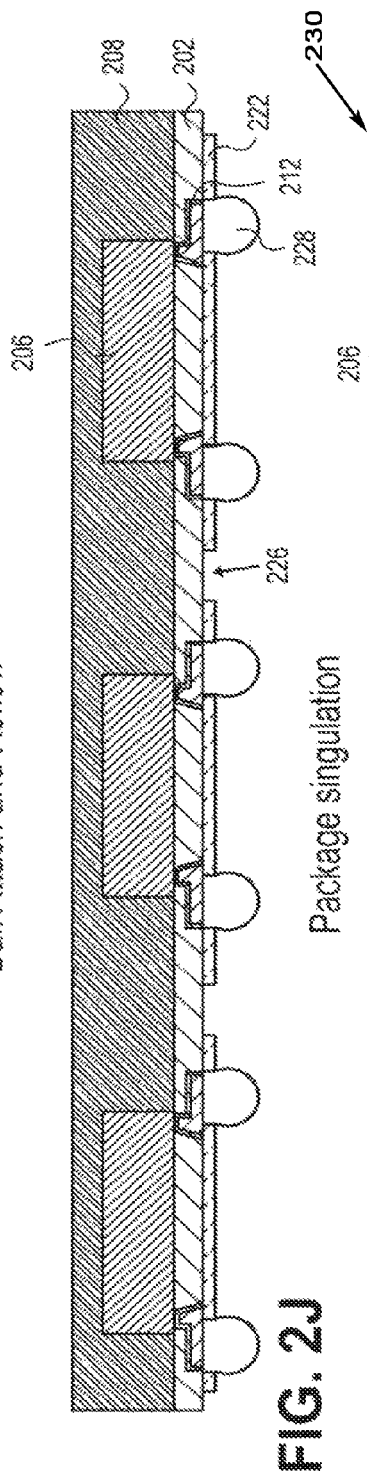
Figure 2K:
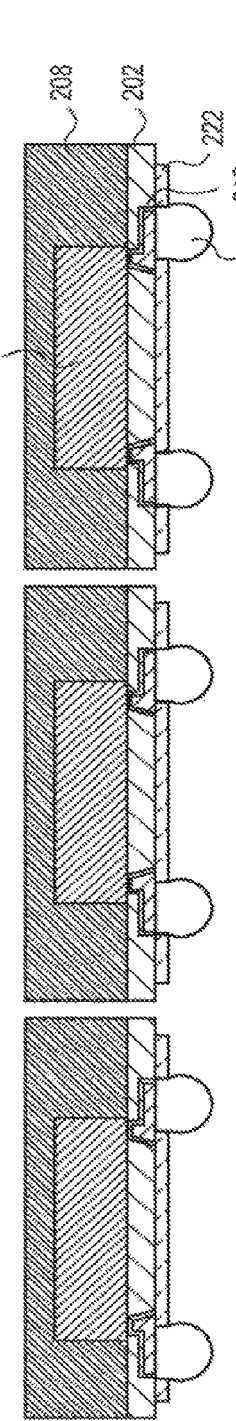
Figure 2L:
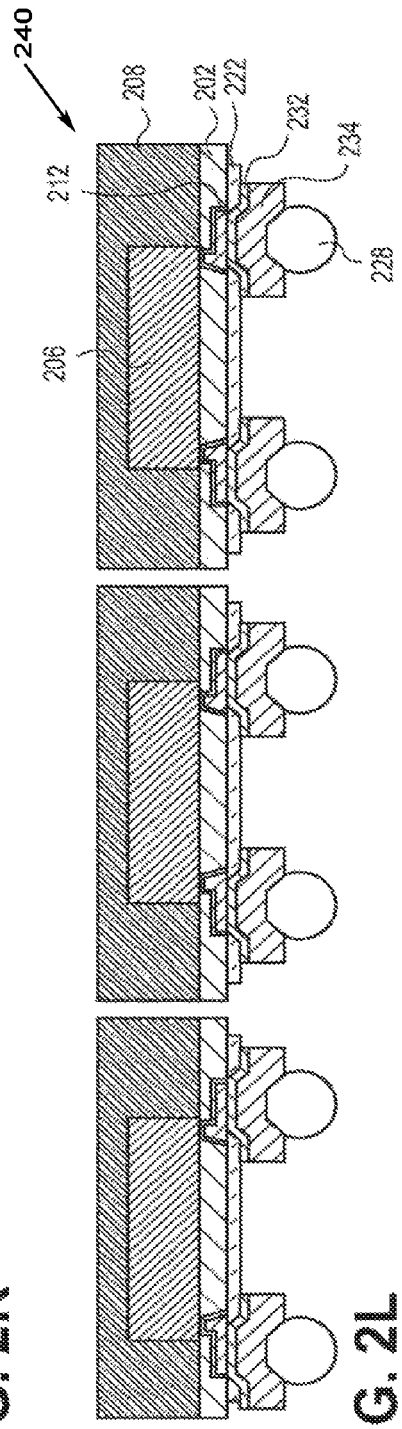

After formation of the RDL 220, second polymer layer 222 may then be formed and patterned utilizing suitable lithographic techniques to form openings 224, 226 as illustrated in FIGS. 2H-2I. Bumps or balls 228, like bumps or balls 128, may be applied within openings 224 over the exposed portions of the RDL trace 220, while openings 226 may assist in singulation of the individual packages as illustrated in FIGS. 2J-2K. In an embodiment illustrated in FIG. 2L a barrier/seed layer 232 and ball grid array capture pad 234 may be formed similarly as described with regard to FIG. 1N.

Figure 3:
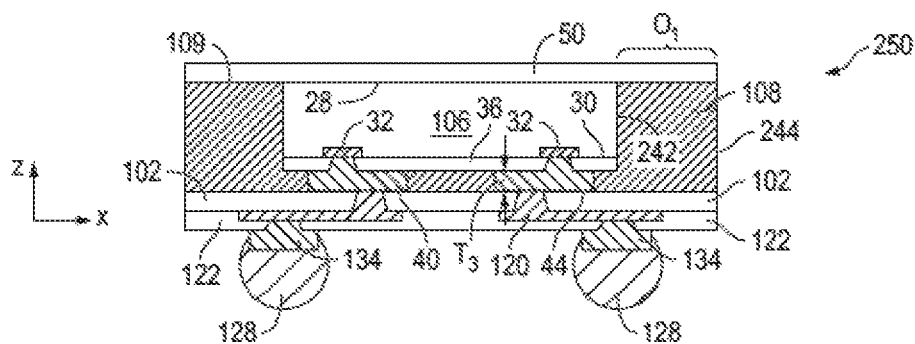
FIG. 3 illustrates a cross-sectional side view of an embodiment of a semiconductor package.

FIGS. 3-6 show cross-sectional profile views of an individual semiconductor devices or package in an X-Z plane, like FIGS. 1A-2L, that can be produced by a process similar to those illustrated in FIGS. 1A-1N and FIGS. 2A-2L. Thus, while aspects of FIGS. 3-6 may be discussed with respect to reference numbers in FIGS. 1A-1N or FIGS. 2A-2L, the corresponding reference numbers or analogous structures in the other FIGs. may also be applicable, but are omitted for brevity. FIG. 3 shows a cross-sectional profile view of an individual semiconductor device or package, while FIG. 7 show a representative top or plan view of the semiconductor device 250, in a x-y plane that is perpendicular, transverse, or orthogonal to the x-z plane of FIG. 3. Package 250 differs from packages 130, 140, 230, and 40 by the inclusion of thick RDL pattern or thick RDL traces 40. The thick RDL 40 can comprise a plurality of RDL traces comprising a thickness or height T3 greater than, or greater than or equal to, 4 μm, 8 μm, 12 μm, 16 μm, or 20 μm. The thickness T3 of the thick RDLs 40 can extend in a z-direction that is perpendicular to, and extends away from, an active surface 30 of the semiconductor die 106. The thick RDLs 40 can be couple to the active surface 30 of the semiconductor die 106 through the contact pads 32 of the semiconductor die. Contact pads 32 or a similar conductive feature can also serve as a point of electrical interconnection for the semiconductor die 106 shown in the semiconductor die shown in FIGS. 1B-2L.

The thick RDL traces 40 can be formed before the semiconductor die 106 are mounted to the permanent dielectric film 102, 202 and the temporary carrier 104, 204. For example, the thick RDL 40 can be formed on the semiconductor die 106, 206 when the semiconductor die 106, 206 are unsingulated from, and are part of, a native wafer from which the semiconductor die 106, 206 are formed. After singulation of the semiconductor die 106 comprising thick RDL traces 40, the plurality of semiconductor die 106 can be placed face down directly on the first surface of the single layer dielectric film 106 with the thick RDLs 40 directly contacting the first surface of the single layer dielectric film 102, similar to the placement of the semiconductor die 106 shown in FIGS. 1B and 2B. A difference between the semiconductor package 250 comprising the additional thick RDLs 40 and the packages 130, 140, 230, and 240 without the thick RDLs 40, can include the additional portion of encapsulant 108 disposed over the active surface 30 of the semiconductor die 106 and the build-up interconnect structure including the permanent dielectric film 102 and the conductive layer 120. An insulating or passivation layer 36 can also be optionally disposed over the active surface 30 and the contact pads 32 of the semiconductor die 106, at the native wafer level, such as before the formation of the thick RDLs 40. Thus, the insulating layer 36, like the encapsulant 108, can also be disposed between the active surface 30 of the semiconductor die 106 and the transfer dielectric 102. Opposite the insulating layer 36, an insulating layer or epoxy film 50 (which can include a solder mask laminate film or die attach epoxy film) can be applied on backside 28 of the semiconductor die 106 and the backside 109 of the encapsulant 108. A thickness of the film 50 disposed on the back surface 28 of the semiconductor die 106 can similar to or equal to the final thickness of the encapsulant, epoxy mold compound, or laminate film, disposed over or on the active surface 30 of the semiconductor die 106 between the active surface 30 and the transfer dielectric 102.

The molding or encapsulating of the semiconductor 106 can be done in such as way that a spacing or offset $O_1$ of encapsulant 108 is formed among the semiconductor die 106 and around a perimeter or sidewall 242 of each of the semiconductor die 106, 206. The offset $O_1$ can be sufficient for additional fan-out structures, or semiconductor components, to be formed within the package 250 and coupled to the semiconductor die 106, 206.

The offset $O_1$, present in FIGS. 3-7 inclusive, may serve to form an edge-protected package with the offset, width, distance, or buffer $O_1$ of encapsulant 108 disposed around and contacting at least four side surfaces 242 of the semiconductor die 106. The offset $O_1$ may comprise a distance in a range of 30-140 μm, 30-100 μm, or 30-60 μm of the encapsulant material 108 around the periphery 242 of the semiconductor die 106 to prevent chipping of the semiconductor die 106 during singulation, to provide a more robust package, and to provide periphery 244 or footprint of the semiconductor packages 250, 260, 270, 280 that is larger that the periphery 242 and footprint of the semiconductor die 106 to absorb wear and tear, such as chipping, in place of the semiconductor die 106 absorbing the wear and tear. In some instances, the offset $O_1$ can provide an area that is free from, or outside a footprint of, the thick RDLs 40.

Figure 4:
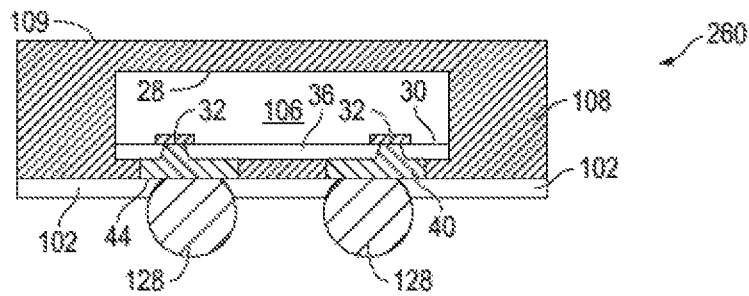
FIG. 4 illustrates a cross-sectional side view of another embodiment of a semiconductor package.

By forming semiconductor package 250 as shown in FIG. 3, the final semiconductor package 250 can comprise an active surface 230 and at least four side surfaces 242 that are encapsulated with a single mold compound or encapsulant 108. As shown in FIG. 4, the encapsulant 108 can also be disposed over the backside 28 of the semiconductor die 106 so that 6 sides or all sides of the semiconductor die 106 can be overmolded or covered with the encapsulant 108. The mold compound 108 can also be disposed around the thick RDL traces 40 to contact sidewalls of the thick RDL traces 40, after which a surface 244 of the thick RDL traces 40 may be exposed through the transfer dielectric 102 by maskless patterning, such as laser ablation. As such, the encapsulation or molding process can be more easily accomplished in a single step than with previous structures and methods requiring a second or separate molded underfill material.

FIG. 4 shows an individual semiconductor package or embedded die package 260 similar to semiconductor package 250 from FIG. 3. Semiconductor package 260 differs from semiconductor package 250 by the omission of conductive layer 120, and insulating or passivation layer 122, resulting in a simplified build-up interconnect structure, and relying on the routing provided by thick RDLs 40 to correctly position bumps 128, rather than relying on both thick RDLs 40 and conductive layer 120.

Figure 5:
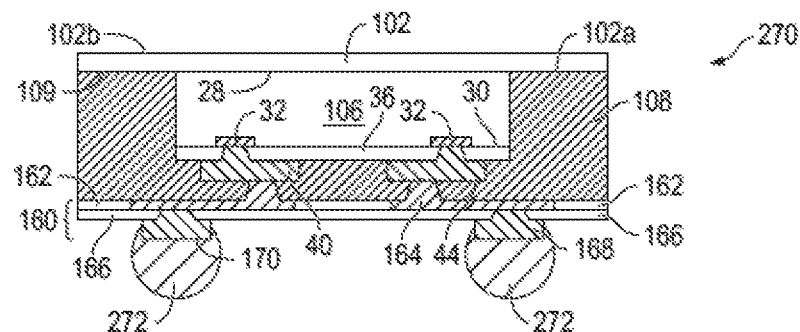
FIG. 5 illustrates a cross-sectional side view of another embodiment of a semiconductor package.
Figure 6:
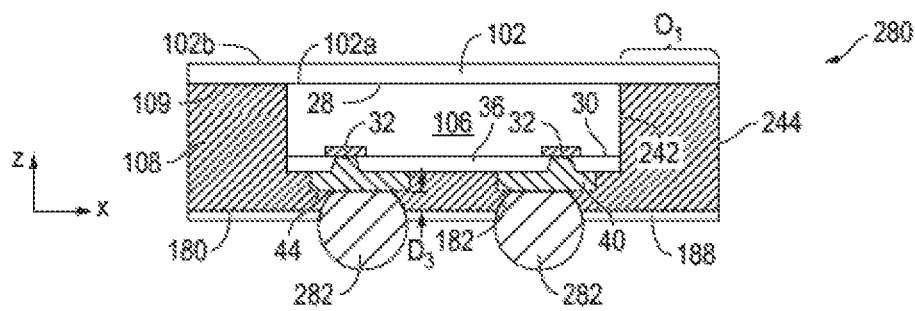
FIG. 6 illustrates a cross-sectional side view of another embodiment of a semiconductor package.
Figure 7:
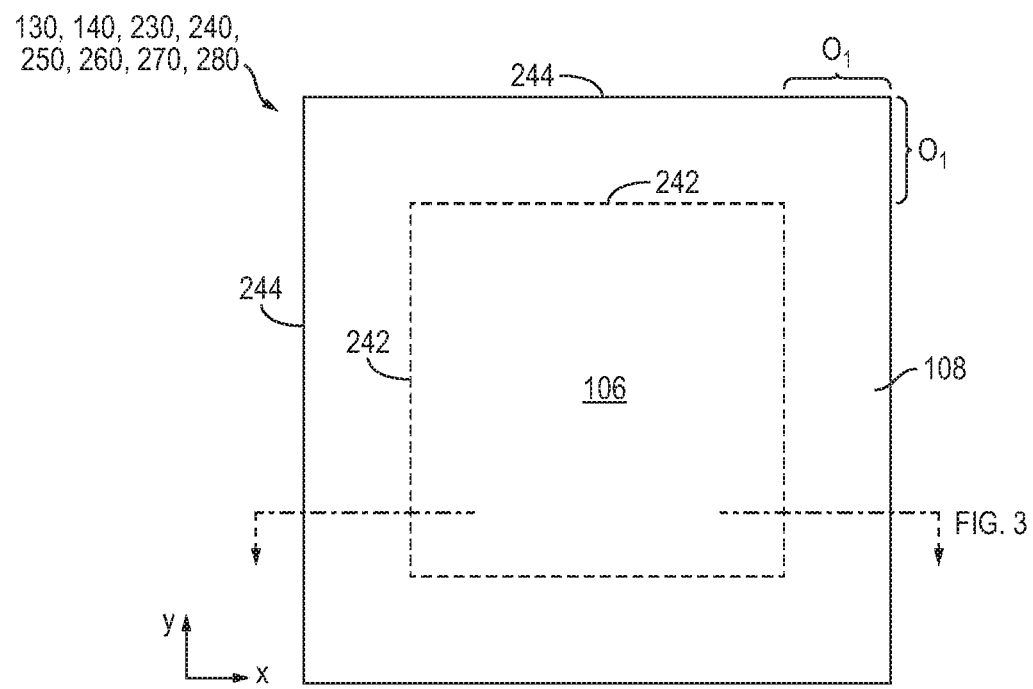
FIG. 7 illustrates a top or plan view of a semiconductor package.

FIGS. 5 and 6 show individual semiconductor packages 270, 280, similar to semiconductor packages 240 and 250, shown in FIGS. 3 and 4, respectively. Semiconductor packages 270, 280 differ from semiconductor packages 240, 250 by being placed face-up on the transfer dielectric layer 102, 202 before being encapsulated with the encapsulant 108, 208, rather than being placed face-up on the transfer dielectric 102, 202. As a result, the back surface 28 of semiconductor die 106, as shown in both FIGS. 5 and 6, are positioned on, or are in direct contact with, a first surface 102a of the transfer dielectric layer 102. A second surface 102b of the transfer dielectric 102 can be opposite the first surface 102a, the second surface being disposed at, or forming, an outer surface of the packages 270, 280.

When overmolding the face-up semiconductor die 106 and thick RDL traces 40, the encapsulant 108 can also be disposed over, and cover, the top surface 44 of the RDL 40, the top surface 44 being the surface of the RDL 40 not in contact or adjacent the semiconductor die 106, the surface 44 facing away from the semiconductor die 106 and being opposite the surface of the RDL 40 adjacent the semiconductor die 106. A thickness of encapsulant 108 can cover and be disposed over the RDL 40, including the surface 44 of the RDL. In some instances, the surface 44 can be exposed by grinding or etching of the encapsulant 108 until the RDL 40 is exposed with respect to the encapsulant as shown in FIGS. 3 and 4. Alternatively, a thickness or portion of encapsulant 108 can remain over a majority of the RDL 40, while select portions of the encapsulant 108 are removed to form openings or vias that expose portions of the RDL 40 through the encapsulant 108. The openings 108 can be formed in the encapsulant 108 by a maskless patterning process, maskless process, or laser ablation, examples of which are shown in both FIGS. 5 and 6.

As shown in FIG. 5, a build-up interconnect structure 160 can be formed over the active surface 30 of semiconductor die 106, and thick RDLs 40. As part of the build-up interconnect structure 160, an insulating layer 162 is conformally applied to, and can have a first surface that follows the contours of, encapsulant 108 and top surface 44 of thick RDL traces 42. Insulation layer 162 can have a second planar surface opposite the first surface. Insulating layer 162 can contain one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 162 can be deposited using printing, spin coating, spray coating, lamination, or other suitable process. Insulating layer 162 can be subsequently patterned and cured using UV exposure followed by developing, or other suitable process. A portion of insulating layer 162 can be removed by laser ablation, etching, or other suitable process to form openings that expose portions of top surface 44 of thick RDL traces 42, according to the configuration and design of semiconductor die 106 and the final semiconductor package 270. In some embodiments, insulating layer 162 can be formed or deposited before the formation of openings in the encapsulant 108 to expose the thick RDLs 40, so that the openings can be formed both in and through insulating layer 162 and encapsulant 108 at a same time or during a same processing step. Alternatively, insulating layer 162 can be formed or deposited after the formation of openings in encapsulant 108 so that the openings in the insulating layer 162 are only formed through the insulating layer and extend to surface 44 of thick RDL traces 40.

An electrically conductive layer 164 can be patterned and deposited over, and in contact with, thick RDL traces 42, encapsulant 108, and insulation layer 162. Conductive layer 164 can be one or more layers of Al, Cu, Sn, Ni, Au, Ag, or other suitable electrically conductive material, and can include one or more of a seed layer, adhesion layer, or barrier layer. The deposition of conductive layer 164 can use PVD, CVD, electrolytic plating, electroless plating, or other suitable process. The openings in insulation layer 162 can extend completely through the insulation layer over thick RDL traces 40. Conductive layer 164 can operate as an RDL comprising a plurality of RDL traces that assist in extending electrical connection from semiconductor die 106 and thick conductive RDL traces 40 to points external to semiconductor die 106. A portion of conductive layer 164 formed within the openings in insulating layer 162 can form vertical interconnect structures or vias that provide electrical interconnection through insulating layer 162. While a non-limiting example of a build-up interconnect structure 160 is illustrated in FIG. 5 comprising a single RDL 164, additional RDLs can also be formed within build-up interconnect structure 160 between conductive layer 168 and thick RDL 40 to provide additional flexibility for routing signals between semiconductor die 24 and points external to the semiconductor die.

FIG. 5 further shows an insulating or passivation layer 166 is conformally applied to, and follows the contours of, insulation layer 162 and conductive layer 164. Insulating layer 166 can contain one or more layers of photosensitive low curing temperature dielectric resist, photosensitive composite resist, LCP, laminate compound film, insulation paste with filler, solder mask resist film, liquid molding compound, granular molding compound, polyimide, BCB, PBO, SiO2, Si3N4, SiON, Ta2O5, Al2O3, or other material having similar insulating and structural properties. Insulating layer 166 can be deposited using printing, spin coating, spray coating, lamination, or other suitable process. Insulating layer 166 can be subsequently patterned and cured using UV exposure followed by developing, or other suitable process. A portion of insulating layer 166 can be removed by laser ablation, etching, or other suitable process to form openings through the insulating layer that expose portions of conductive layer 164.

An electrically conductive layer 168 can be patterned and deposited over, and be in contact with, conductive layer 164 and insulating layer 166. Conductive layer 168 can be one or more layers of Al, Cu, Sn, Ni, Au, Ag, or other suitable electrically conductive material. The deposition of conductive layer 168 can use PVD, CVD, electrolytic plating, electroless plating, or other suitable process. The openings in insulating layer 166 into which conductive layer 168 is disposed can extend completely through the insulation layer over conductive layer 164. At least a portion of conductive layer 168 can be formed within the openings in insulating layer 166 and form a vertical interconnect structure or vias that provide electrical interconnection through insulating layer 166 to connect to conductive layer 164.

Conductive layer 168 can comprise a top portion or surface that is formed as a pad 170. Pad 170 can comprise a horizontal component that includes an area greater than an area of the opening formed in insulating layer 166 such that pad 170 of conductive layer 168 extends over a top or upper surface of insulating layer 166. Pad 170 of conductive layer 168 can be an I/O interconnect at a periphery of a completed semiconductor package. As such, pads 170 can be formed as UBM pads or LGA pads that are coupled to I/O interconnects at a periphery of a completed semiconductor package such as, for example, solder bumps; or alternatively, can be themselves I/O interconnects. Pads 170 can be stacks of multiple metal layers including adhesion, barrier, seed, and wetting layers. Pads 170 can comprise one or more layers of Ti, TiN, TiW, Al, Cu, Cr, CrCu, Ni, NiV, Pd, Pt, Au, Ag or other suitable material or combination of materials. In an embodiment, pads 170 can comprise a TiW seed layer, a Cu Seed layer, and a Cu UBM layer.

FIG. 5 shows an electrically conductive bump material can be deposited over pads 170, which as indicated above, can be UBM pads that act as an intermediate conductive layer between semiconductor die 106 and subsequently formed bumps or other I/O interconnect structures. Pads 170 can comprise UBM pads that provide a low resistive interconnect to conductive layers 164 and thick RDL traces 40, and can also provide a barrier to solder diffusion, and an increase in solder wettability. An electrically conductive bump material can be deposited over pads 170 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material can be bonded to pads 170 using a suitable attachment or bonding process. In an embodiment, the bump material is reflowed by heating the material above its melting point to form spherical balls or bumps 272. In some applications, bumps 272 are reflowed a second time to improve electrical contact to pads 170. Bumps 272 can also be compression bonded to pads 170. Bumps 272 represent one type of interconnect structure that can be formed over pads 170. Other interconnect structures can also be used, including conductive paste, stud bump, micro bump, or other electrical interconnect.

FIG. 6 shows the semiconductor package 280 differs from the semiconductor package 270 by omission of build-up interconnect structure 160, resulting in a simplified interconnect structure that relies on the routing provided by thick RDLs 40 to correctly position bumps 282, rather than relying on both thick RDLs 40 and conductive layer 120 or 162. As such, a footprint of the thick conductive RDL traces 40 and the bumps or balls 282 can be contained within a footprint of the semiconductor die 106.

FIG. 7 shows a top or plan view of an edge protected package like packages 130, 140, 230, 240, 250, 260, 270, and 280 with an offset, width, distance, or buffer $O_1$.

In the foregoing specification, various embodiments of the invention have been described. It will, however, be evident that various modifications and changes may be made thereto without departing from the broader spirit and scope of the invention as set forth in the appended claims. It is contemplated that a variety of build-up structures and processes could be applied after formation of the first level via in the dielectric film utilizing a mask-less patterning technique such as laser ablation. The specification and drawings are, accordingly, to be regarded in an illustrative sense rather than a restrictive sense.

What is claimed is:

1. A method of making a semiconductor package, comprising:

placing a single layer dielectric film comprising a first surface and a second surface opposite the first surface directly on a temporary carrier substrate, wherein the first surface and the second surface of the single layer dielectric film are substantially parallel;

placing a plurality of semiconductor die face down directly on the first surface of the single layer dielectric film opposite the second surface of the dielectric film attached to the temporary carrier substrate, wherein the plurality of semiconductor die is disposed over the temporary carrier substrate;

curing the single layer dielectric film after placing the plurality of semiconductor die on the first surface of the single layer dielectric film to lock the plurality of semiconductor die in place on the single layer dielectric film and to render the single layer dielectric film non-photoimageable;

encapsulating the plurality of semiconductor die on the cured single layer dielectric film with an encapsulant while the temporary carrier substrate supports the single layer dielectric film and the plurality of semiconductor die;

releasing the temporary carrier substrate from the cured single layer dielectric film after encapsulating the plurality of semiconductor die on the cured single layer dielectric film, and prior to patterning the cured single layer dielectric film;

patterning the cured single layer dielectric film utilizing a mask-less patterning technique to form redistribution layer (RDL) trace pattern openings and to form a via hole that extends from the first surface of the cured single layer dielectric film to the second surface of the cured single layer dielectric film after having removed the temporary carrier substrate;

forming a thick conductive RDL trace comprising a thickness greater than 8 micrometers (µm) that extends over the plurality of semiconductor die and directly contacts the second surface of the patterned cured single layer dielectric film in the RDL trace pattern openings and in the via hole, the thick conductive RDL trace being substantially parallel to, and extending across, the second surface of the patterned cured single layer dielectric film; and singulating the plurality of semiconductor die by cutting through the encapsulant and the cured single layer dielectric film to form individual packages.

2. The method of claim 1, wherein placing the plurality of semiconductor die on the first surface of the single layer dielectric film comprises placing the plurality of semiconductor die on a surface of a B-stage cured epoxy.

3. The method of claim 1, further comprising using laser ablation to form both the via holes and the RDL trace pattern openings within the single layer dielectric film, the RDL trace pattern openings intersecting with the via holes in the single layer dielectric film in a stair step fashion.

4. The method of claim 1, further comprising:
applying a photoimageable polymer layer over the patterned cured single layer dielectric film;
forming a plurality of openings in the photoimageable polymer layer using a photolithographic patterning technique; and
cutting through the cured single layer dielectric film and the encapsulant without cutting through the photoimageable polymer layer to singulate the plurality of semiconductor die.

5. The method of claim 1, further comprising forming the thick conductive layer comprising a thickness greater than or equal to 20 µm.

6. The method of claim 1, wherein a composition of the encapsulant is the same as a composition of the dielectric film.

7. The method of claim 1, wherein the single layer dielectric film comprises a thickness in a range of 5-50 micrometers, a glass transition temperature (Tg) in a range of 140-190° C., and further comprises 50-90% of ceramic filler or silica filler by weight.

8. The method of claim 1, further comprising placing an active surface of the plurality of semiconductor die on the first surface of the single layer dielectric film.

9. A method of making a semiconductor package, comprising:
placing a single layer dielectric film on a temporary carrier substrate, the single layer dielectric film comprising a first surface and a second surface opposite the first surface;
placing a plurality of semiconductor die directly on the first surface of the single layer dielectric film opposite the second surface of the single layer dielectric film attached to the temporary carrier substrate;
curing the single layer dielectric film after placing the plurality of semiconductor die on the first surface of the single layer dielectric film to lock the plurality of semiconductor die in place on the single layer dielectric film;
encapsulating the plurality of semiconductor die directly on the single layer dielectric film with an encapsulant;
patterning the single layer dielectric film utilizing a maskless patterning technique to form a via hole that extends from the first surface of the cured single layer dielectric film to the second surface of the cured single layer dielectric film after removing the temporary carrier substrate; and forming a conductive layer directly on, substantially parallel to, and extending across, the second surface of the patterned single layer dielectric film, within the vial hole, and over the plurality of semiconductor die.

10. The method of claim 9, further comprising placing an active surface of the plurality of semiconductor die on the first surface of the single layer dielectric film.

11. The method of claim 9, further comprising:
laminating the single layer dielectric film to the temporary carrier substrate at a temperature in a range of 100-130° C., wherein the single layer dielectric film comprises a thickness in a range of 5-50 micrometers, a glass transition temperature (Tg) in a range of 140-190° C., and further comprises 50-90% of ceramic filler or silica filler by weight; and
after laminating the single layer dielectric film to the temporary carrier, placing the plurality of semiconductor die directly on the first surface of the single layer dielectric film, and curing the single layer dielectric film at a temperature greater than the glass transition temperature (Tg) of the single layer dielectric film.

12. The method of claim 9, further comprising using laser ablation to form the via hole comprising a first depth and redistribution layer (RDL) trace pattern openings comprising a second depth less than the first depth to intersect with the via hole in the single layer dielectric film.

13. The method of claim 9, further comprising forming the conductive layer as a thick redistributions layer (RDL) trace comprising a thickness greater than or equal to 20 µm.

14. The method of claim 9, further comprising:
forming the plurality of semiconductor die with thick RDL traces formed while the plurality of semiconductor die is part of a native wafer; and
placing the plurality of semiconductor die directly on the first surface of the single layer dielectric film with the thick RDLs directly contacting the first surface of the single layer dielectric film.

15. A method of making a semiconductor package, comprising:
placing a single layer dielectric film on a temporary carrier substrate, the single layer dielectric film comprising a first surface and a second surface opposite the first surface;
placing a plurality of semiconductor die directly on the first surface of the single layer dielectric film with the plurality of semiconductor die disposed over the temporary carrier substrate;
curing the single layer dielectric film after placing the plurality of semiconductor die on the surface of the single layer dielectric film;
encapsulating the plurality of semiconductor die on the single layer dielectric film with an encapsulant while the temporary carrier substrate supports the single layer dielectric film and the plurality of semiconductor die;
patterning the single layer dielectric film and leaving a portion of the single layer dielectric film disposed over an active surface of the plurality of semiconductor die; and
forming a conductive layer directly on, and extending across, the second surface of the patterned single layer dielectric film and over the plurality of semiconductor die.

16. The method of claim 15, wherein a composition of the encapsulant is the same as a composition of the single layer dielectric film.

17. The method of claim 15, wherein the single layer dielectric film comprises a thickness in a range of 5-50 micrometers, a glass transition temperature (Tg) in a range of 140-190° C., and further comprises 50-90% of ceramic filler or silica filler by weight.

18. The method of claim 15, further comprising using laser ablation to form both vias and a redistribution layer trace pattern openings in within the single layer dielectric film, the RDL trace pattern intersecting with the vias in the single layer dielectric film in a stair step fashion.

19. The method of claim 15, wherein the conductive layer comprises a thick redistribution layer comprising a thickness greater than or equal to 20 $\mu$m.

* * * * *

UNITED STATES PATENT AND TRADEMARK OFFICE
CERTIFICATE OF CORRECTION

PATENT NO. : 9,754,835 B2
APPLICATION NO. : 15/292082
DATED : September 5, 2017
INVENTOR(S) : Christopher M. Scanlan et al.

It is certified that error appears in the above-identified patent and that said Letters Patent is hereby corrected as shown below:

In the Claims

Claim 9, Column 20, Line 6, reads "vial hole" and should read -- via hole --

Signed and Sealed this
Twenty-third Day of October, 2018

Andrei Iancu
*Director of the United States Patent and Trademark Office*